(12) United States Patent
Yamazaki et al.

(10) Patent No.: US 6,359,320 B1
(45) Date of Patent: Mar. 19, 2002

(54) THIN-FILM TRANSISTOR WITH LIGHTLY-DOPED DRAIN

(75) Inventors: Shunpei Yamazaki, Tokyo; Setsuo Nakajima; Hideaki Kuwabara, both of Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/387,053

(22) Filed: Aug. 31, 1999

(30) Foreign Application Priority Data

Sep. 4, 1998 (JP) .......................................... 10-251675

(51) Int. Cl.⁷ .......................................... H01L 31/113
(52) U.S. Cl. .......................... 257/408; 257/59; 257/61; 345/92
(58) Field of Search .......................... 257/408, 59, 61; 345/92

(56) References Cited

U.S. PATENT DOCUMENTS

| | | | | |
|---|---|---|---|---|
| 5,471,330 A | * | 11/1995 | Sarma | 349/43 |
| 5,763,301 A | | 6/1998 | Rha et al. | 438/149 |
| 5,767,531 A | * | 6/1998 | Yoshinouchi | 257/72 |
| 5,818,067 A | | 10/1998 | Rha et al. | 257/57 |
| 5,861,656 A | * | 1/1999 | Keri | 257/491 |
| 6,147,667 A | * | 11/2000 | Yamazaki et al. | 345/92 |
| 6,246,070 B1 | * | 6/2001 | Yamazaki et al. | 257/40 |

FOREIGN PATENT DOCUMENTS

| | | | | |
|---|---|---|---|---|
| JP | 58163722 A | * | 9/1983 | 252/608 |
| JP | 610707080 A | * | 4/1986 | |
| JP | 7-142734 | | 6/1995 | |

OTHER PUBLICATIONS

Wolf, Silicon Processing for the VLSI Era, 1990, Lattice Press, vol. 2, pp. 273–274, 354, 356–357, 359.*

* cited by examiner

Primary Examiner—Nathan Flynn
Assistant Examiner—Scott R Wilson
(74) Attorney, Agent, or Firm—Nixon Peabody LLP; Jeffrey L. Costellia

(57) ABSTRACT

There is provided a semiconductor device including a semiconductor circuit formed by semiconductor elements having an LDD structure which has high reproducibility, improves the stability of TFTs and provides high productivity and a method for manufacturing the same.

In order to achieve the object, the design of a second mask is appropriately determined in accordance with requirements associated with the circuit configuration to make it possible to form a desired LDD region on both sides or one side of the channel formation region of a TFT.

42 Claims, 13 Drawing Sheets

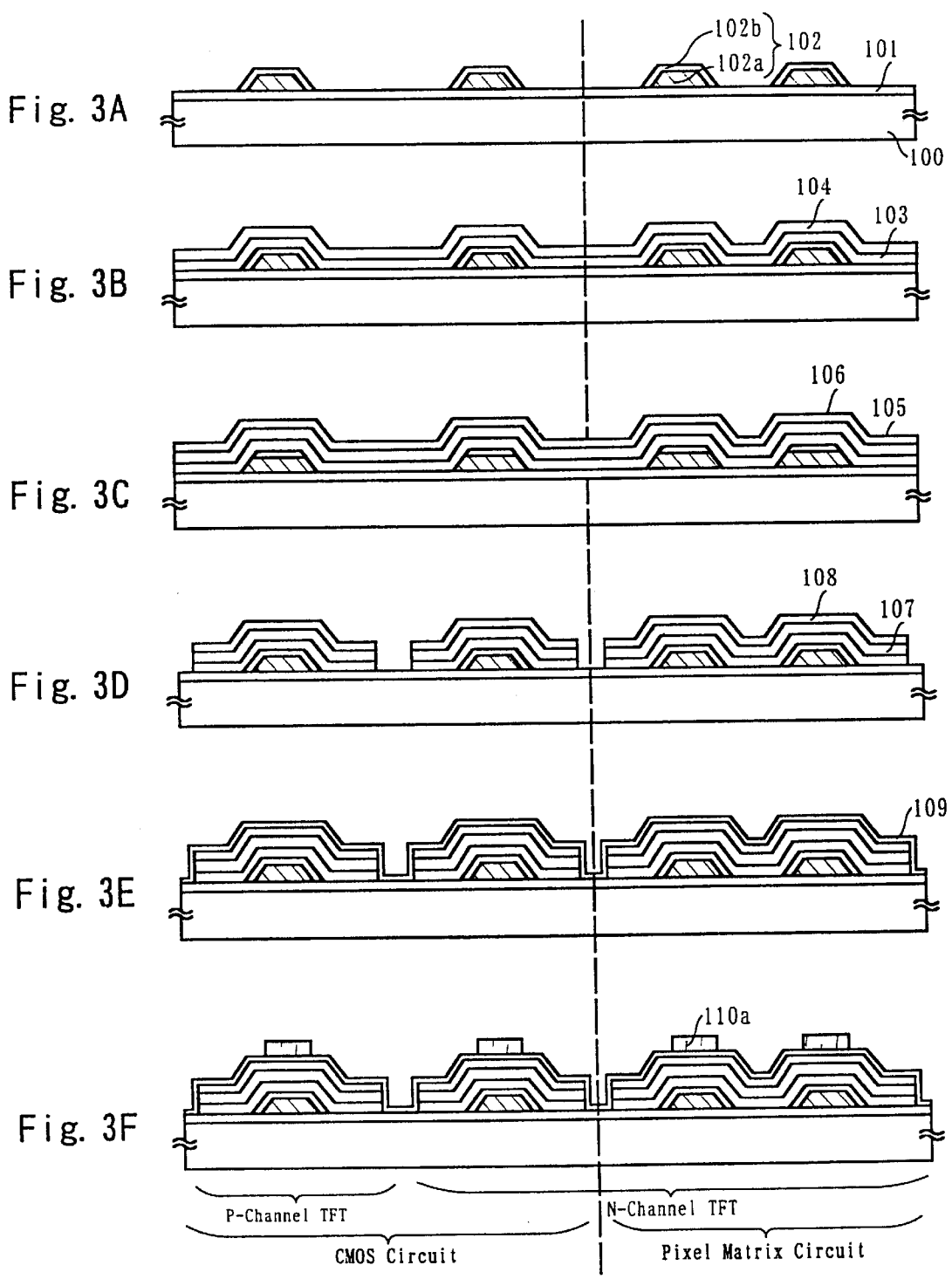

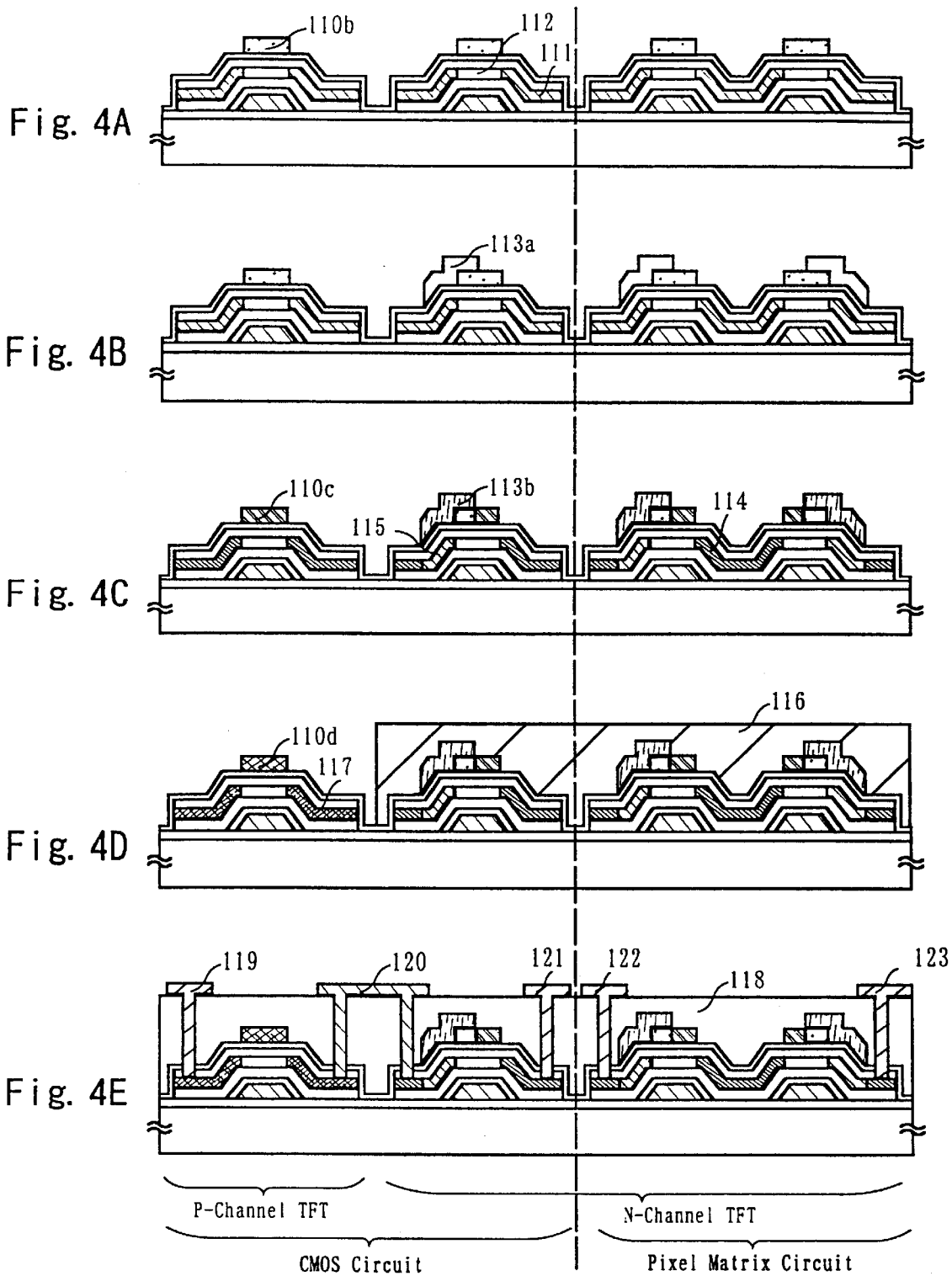

Pixel Matrix Circuit (A-A')

Pixel Matrix Circuit (A-A')

Buffer Circuit
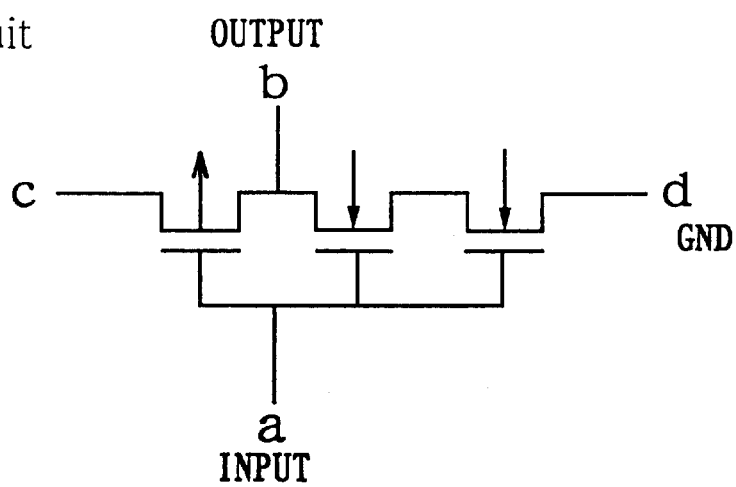
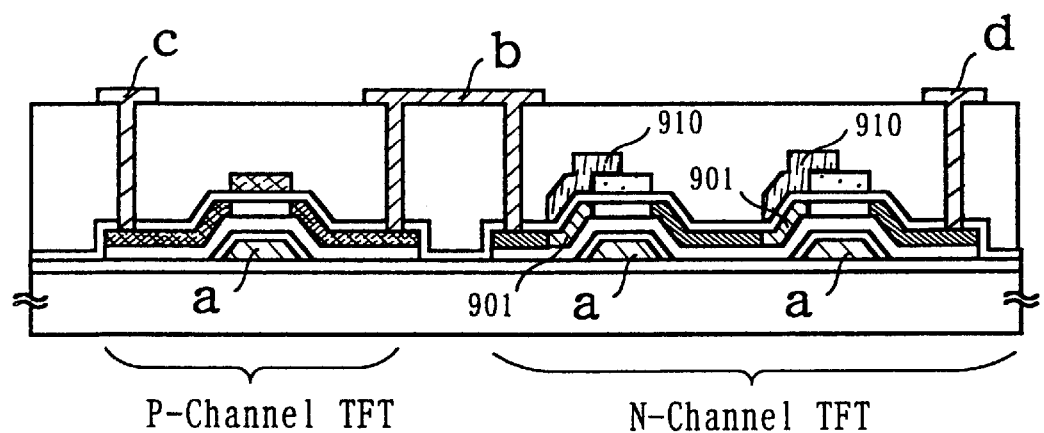
P-Channel TFT    N-Channel TFT
Fig. 9

THIN-FILM TRANSISTOR WITH LIGHTLY-DOPED DRAIN

BACKGROUND OF THE INVENTION

1. Field of the Invention

The present invention relates to a structure of a semiconductor device having a semiconductor circuit comprised of semiconductor elements such as insulated gate transistors and a method for manufacturing the same. More particularly, the invention relates to a structure of a semiconductor device having a semiconductor circuit comprised of semiconductor elements having an LDD structure formed of organic resin and a method for manufacturing the same. Semiconductor devices according to the invention include not only elements such as thin film transistors (TFTs) and MOS transistors but also displays having a semiconductor circuit and electro-optical devices such as image sensors formed by such insulated gate transistors. In addition, semiconductor devices according to the invention include electronic equipments loaded with such displays and electro-optical devices.

2. Description of the Related Art

TFTs have been conventionally used as switching elements of active matrix liquid crystal displays (hereinafter abbreviated to read "AMLCD"). The market is currently dominated by products having circuits formed by TFTs utilizing an amorphous silicon film as an active layer. Particularly, a widely used TFT structure is the reverse staggered structure, which allows simple manufacturing steps.

However, the accelerating trend toward AMLCDs with higher performance in recent years has resulted in more severe requirements on the operational performance (especially, operating speed) of TFTs. It has therefore become difficult to provide elements having sufficient performance utilizing TFTs comprising amorphous silicon films because of their operating speed.

Under such circumstances, TFTs utilizing polycrystalline silicon films (polysilicon films) have come into focus in place of amorphous silicon films, which has significantly accelerated the development of TFTs utilizing a polycrystalline silicon film as an active layer. Presently, some products have already been introduced.

Many reports have already been made on structures of reverse staggered TFTs utilizing a polycrystalline silicon film as an active layer. However, conventional reverse staggered structures have had various problems.

First, since an active layer as a whole employed in such structures is as very thin as about 50 nm, impact ionization occurs at the junction between a channel formation region and a drain region, which results in significant deteriorating phenomena such as the implantation of hot carriers. This necessitates the formation of an LDD region (light doped drain region).

It is expected that at least eight masks are required (for processes up to the formation of source and drain electrodes) to form such an LDD region in a conventional reverse staggered TFT structure.

As described above, in a conventional reverse staggered TFT structure, an LDD region must be formed in a horizontal plane on both sides or one side of a channel formation region, which makes it very difficult to form LDD regions with reproducibility.

It is an object of the invention to provide a technique for manufacturing semiconductor devices with high massproductivity, reliability and reproducibility through very simple manufacturing steps.

SUMMARY OF THE INVENTION

According to a first aspect of the invention, there is provided a semiconductor device including a semiconductor circuit formed by semiconductor elements, characterized in that it comprises:

a gate line provided on an insulated surface;

a gate insulating film in contact with the gate line;

a channel formation region provided on the gate line with the gate insulating film interposed therebetween;

a low density impurity region in contact with the channel formation region;

a high density impurity region in contact with the low density impurity region;

a protective film in contact with the channel formation region; and organic resin doped with a trivalent or pentavalent impurity in contact with the protective film.

According to a second aspect of the invention, there is provided a semiconductor device including a semiconductor circuit formed by semiconductor elements, characterized in that it comprises:

a gate line provided on an insulated surface;

a gate insulating film in contact with the gate line;

a channel formation region provided on the gate line with the gate insulating film interposed therebetween;

a low density impurity region provided on one side of the channel formation region;

a drain region constituted by a first high density impurity region in contact with the low density impurity region;

a source region constituted by a second high density impurity region provided on the other side of the channel formation region;

a protective film in contact with the channel formation region; and organic resin doped with a trivalent or pentavalent impurity in contact with the protective film.

According to a third aspect of the invention, there is provided a semiconductor device including a semiconductor circuit formed by semiconductor elements, characterized in that it comprises:

a gate line provided on an insulated surface;

a gate insulating film in contact with the gate line;

a channel formation region provided on the gate line with the gate insulating film interposed therebetween;

a first low density impurity region and a second low density impurity region in contact with the channel formation region;

a high density impurity region on contact with the first low density impurity region and the second low density impurity region;

a protective film in contact with the channel formation region; and organic resin doped with a trivalent or pentavalent impurity in contact with the protective film and in that the width of the first low density impurity region in the direction of the channel length is different from the width of the second low density impurity region in the direction of the channel length.

There is provided a configuration according to each of the above-described aspects, characterized in that the gate line has a single-layer or multi-layer structure and is made of one kind of element selected from among tantalum, copper, chromium, aluminum, molybdenum, titanium and silicon or a material primarily constituted by silicon doped with a p-type or n-type impurity.

There is provided a configuration according to each of the above-described aspects, characterized in that the trivalent or pentavalent impurity is phosphorus or boron.

There is provided a configuration according to each of the above-described aspects, characterized in that the organic resin has photosensitivity.

There is provided a configuration according to each of the above-described aspects, characterized in that the density of the trivalent or pentavalent impurity in the organic resin is $1 \times 10^{19}$ atoms/cm$^3$ or more.

There is provided a configuration according to each of the above-described aspects, characterized in that a catalytic element for promoting the crystallization of silicon is included in the high density impurity region.

It is also characteristic of the invention that the catalytic element is at least one or a plurality of elements selected from among Ni, Fe, Co, Pt, Cu and Au and that the catalytic element is Ge or Pb.

In the context of the present specification, "initial semiconductor film" is a generic term for semiconductor films which typically means semiconductor films having amorphous properties, e.g., amorphous semiconductor films (amorphous silicon films and the like), amorphous semiconductor films including micro-crystals and micro-crystal semiconductor films. Such semiconductor films include Si films, Ge films and compound semiconductor films (e.g., $Si_xGe_{1-x}$ (0<X<1) which is an amorphous silicon germanium film, "x" typically being in the range from 0.3 to 0.95. Such an initial semiconductor film can be formed using, for example, low pressure CVD, thermal CVD, PCVD, sputtering or the like.

In the context of the present specification, the term "crystalline semiconductor film" implies single crystal semiconductor films and semiconductor films including grain boundaries (including polycrystalline semiconductor films and micro-crystal semiconductor films) and clearly distinguishes them from semiconductors which are in an amorphous state in its entirety (amorphous semiconductor films). When the term "semiconductor film" is used in the present specification, it obviously implies not only crystalline semiconductor films but also amorphous semiconductor films.

In the context of the present specification, the term "semiconductor element" implies switching elements and memory elements, e.g., thin film transistors (TFTs) and thin film diodes (TFDs).

A first method for manufacturing a semiconductor device including a semiconductor circuit formed by semiconductor elements according to the invention is characterized in that it comprises;

a first step of sequentially forming a gate insulating film and an initial semiconductor film on an insulated surface having gate lines formed thereon such that they are stacked without being exposed to the atmosphere;

a second step of crystallizing the initial semiconductor film by irradiating it with infrared light or ultraviolet light to form a crystalline semiconductor film and an oxide film simultaneously; and a third step of covering a region to become a channel formation region of the crystalline semiconductor film with a mask and doping a region to become a source region or drain region of the crystalline semiconductor film with the trivalent or pentavalent impurity element through the oxide film.

The first method of manufacture described above is further characterized in that it comprises a step of retaining a catalytic element for promoting the crystallization of silicon in contact with the surface of the initial semiconductor film or within the film after the first step.

According to the present invention, there is provided a second method for manufacturing a semiconductor device including a semiconductor circuit formed by semiconductor element, characterized in that it comprises the steps of:

sequentially forming a gate insulating film, an initial semiconductor film and an insulating film on an insulated surface having gate lines formed thereon such that they are stacked without being exposed to the atmosphere;

crystallizing the initial semiconductor film by irradiating it with infrared light or ultraviolet light through the insulating film to form a crystalline semiconductor film; and covering a region to become a channel formation region of the crystalline semiconductor film with a mask and doping a region to become a source region or drain region of the crystalline semiconductor film with a trivalent or pentavalent impurity element through the insulating film.

The second method of manufacture described above is further characterized in that the gate insulating film, initial semiconductor film and protective film are formed using different chambers.

The second method of manufacture described above is further characterized in that the gate insulating film, initial semiconductor film and protective film are formed using the same chamber.

The second method of manufacture described above is further characterized in that the gate insulating film and protective film are formed using a first chamber and the initial semiconductor film is formed using a second chamber.

The configuration of each of the methods for manufacture described above is characterized in that contaminants on the surface on which the initial semiconductor film is to be formed are reduced using active hydrogen or a hydride.

The configuration of each of the methods for manufacture described above is characterized in that it comprises the step of forming a multi-layer film including a silicon nitride film as any of the layers as the gate insulating film.

The configuration of each of the methods for manufacture described above is characterized in that it comprises the step of forming a multi-layer film including BCB (benzocyclobutene) as a part of the gate insulating film.

BRIEF DESCRIPTION OF THE DRAWINGS

FIGS. 3A through 3F illustrate steps for manufacturing TFTs according to the first embodiment.

FIGS. 4A through 4E illustrate steps for manufacturing TFTs according to the first embodiment.

FIG. 9 show a circuit diagram and a sectional structure of a buffer circuit according to a ninth embodiment of the invention.

DETAILED DESCRIPTION OF PRFEREED EMBODIMENTS

Figure 1:
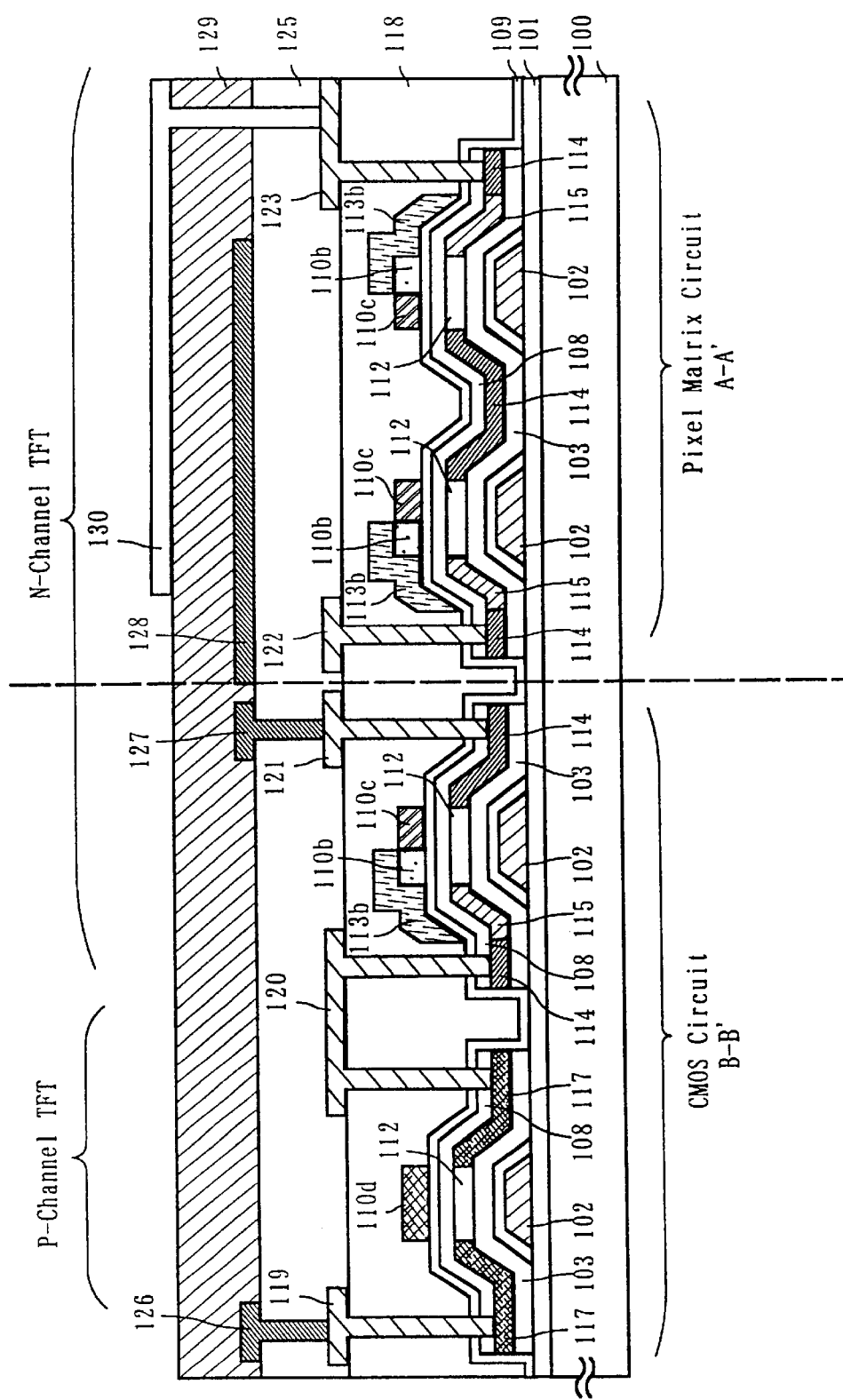
FIG. 1 is a sectional view showing an example of a structure of a semiconductor device according to a first embodiment of the invention.

Modes for carrying out the invention having the above-described configurations will now be described with reference to embodiment disclosed below.

A first embodiment will now be described. A typical embodiment of the present invention will now be described with reference to FIGS. 1 through 4. The present embodiment will be described with reference to a CMOS circuit that forms a part of a peripheral driving circuit portion and a pixel TFT that forms a part of a pixel matrix circuit portion provided on the same substrate. A description will be made with reference to FIGS. 3 and 4 on a method for manufacturing a semiconductor device including a semiconductor circuit formed by semiconductor elements according to the invention.

A substrate 100 is first prepared. The substrate 100 may be a glass substrate, a quartz substrate, an insulating substrate such as crystalline glass, a ceramic substrate, a stainless steel substrate, a metal (tantalum, tungsten, molybdenum or the like) substrate, a semiconductor substrate, a plastic substrate (polyethylene terephtalate substrate) or the like. In the present embodiment, a glass substrate (Coning 1737 having a distortion point at 667° C.) is used as the substrate 100.

Next, an underlying film 101 is formed on the substrate 100. A silicon oxide film, a silicon nitride film, a silicon nitride oxide film ($SiO_xN_y$) or a multi-layer consisting of such films may be used as the underlying film 101. The underlying film 101 may have a thickness in the range from 200 to 500 nm. In the present embodiment, a silicon nitride film having a thickness of 300 nm was formed as the underlying film 101 to prevent contaminant from spreading from the glass substrate. Although the present invention may be implemented without the underlying film, the underlying film is preferably provided to achieve good TFT characteristics.

A gate line 102 having a single-layer or multi-layer structure is formed (FIG. 3A). The gate line 102 has a structure including at least one layer primarily constituted by silicon (Si), silicide or the like doped with a conductive material or a semiconductor material, e.g., aluminum (Al), tantalum (Ta), copper (Cu), niobium (Nb), hafnium (Hf), zirconium (Zr), titanium (Ti), chromium (Cr) or a p-type or n-type impurity. In the present embodiment, the gate line 102 has a multi-layer structure constituted by a tantalum layer 102a having a tantalum oxide layer 102b on the surface thereof. In the present embodiment, the gate line was formed by patterning a tantalum film and by oxidizing the surface thereof through anodization thereafter. Tantalum is a preferable material that causes less shift of the threshold of a TFT because its work function is close to that of silicon. The gate line 102 used preferably has a thickness in the range from 10 to 1000 nm, more preferably, in the range from 30 to 300 nm. A step may be adopted to form an anodic film or insulating film only on the surface or upper surface of the gate line. In order to prevent impurities from spreading from the substrate and gate line to the gate insulating film during manufacture, a step may be added to form an insulating film to cover the gate line and substrate. When a multiplicity of gate lines are formed from a large substrate, at least one layer made of copper may be formed on the gate lines using plating or sputtering. Which is preferable in reducing the resistance of the line.

Next, a gate insulating film 103 and a semiconductor film 104 are sequentially formed into a multiplicity of layers without exposing them to the atmosphere (FIG. 3B). While any means such as plasma CVD and sputtering may be used to form them at this time, it is important to block them from the atmosphere in order to prevent any contaminant in the atmosphere from sticking to any layer interface. Active hydrogen or a hydride is preferably used on the surface on which the semiconductor film is to be formed immediately before the formation of the film in order to reduce contaminant.

Figure 13:
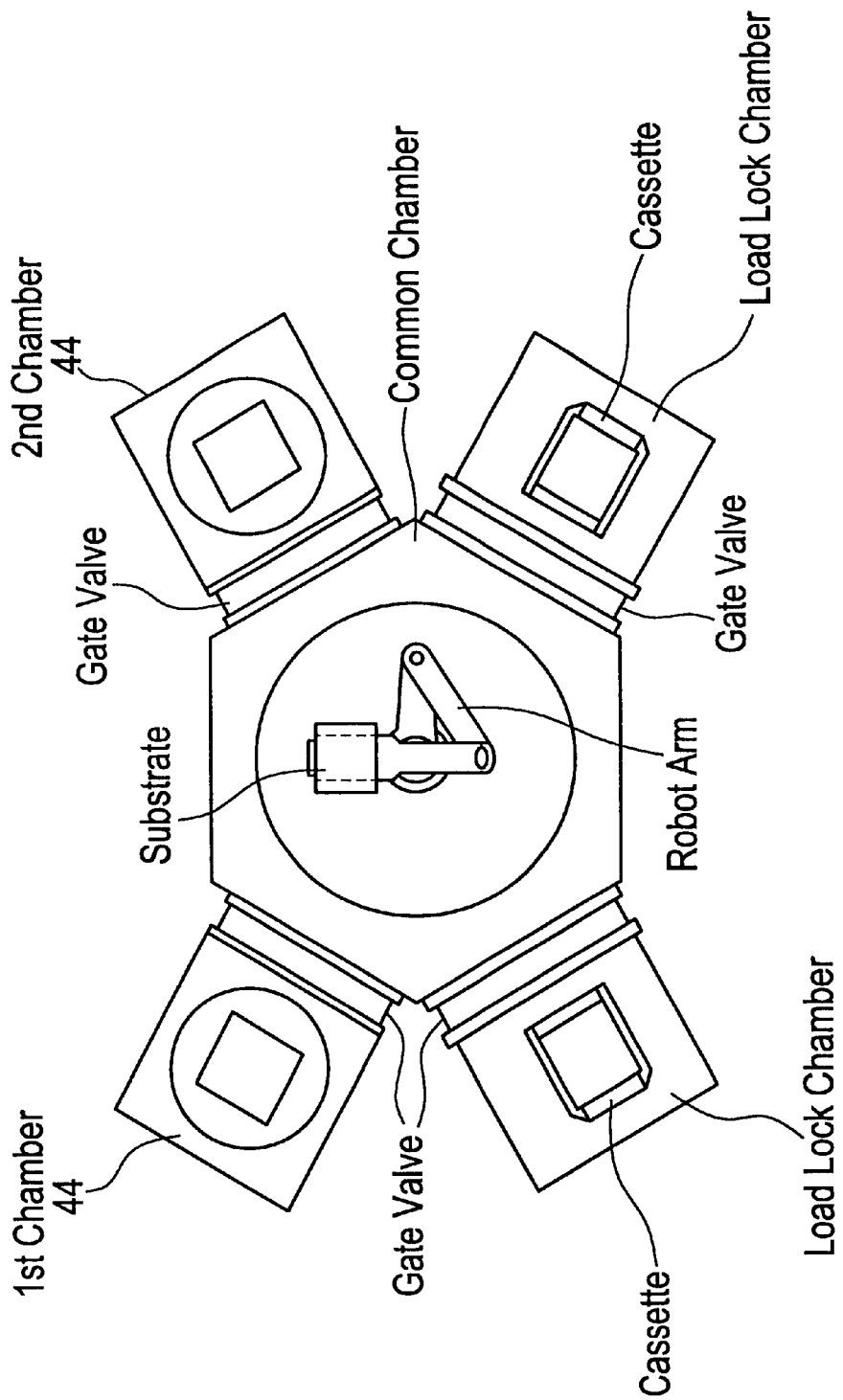
FIG. 13 illustrates an example of a film forming device according to the first embodiment.

In the present embodiment, a silicon nitride oxide film having a thickness of 125 nm and an amorphous silicon film having a thickness of 50 nm were formed as the gate insulating film 103 and semiconductor film 104 respectively to into a multilayer structure. Obviously, the thickness of each of the films is not limited to the present embodiment and may be appropriately determined by a person who carries out the invention. In the present embodiment, the multi-layer structure was formed by using a multi-chamber (an apparatus as shown in FIG. 13) including a first chamber 44 exclusively used to form the gate insulating film and a second chamber 45 exclusively used to form the semiconductor film (an amorphous silicon film in this case) and by moving the films through the chambers without exposing them to the atmosphere. The multi-layer structure may also be formed using the same chamber with the reactive gas replaced.

A silicon oxide film, a silicon nitride film, a silicon nitride oxide film ($SiO_xN_y$), a multi-layer film consisting of them or the like having a thickness in the range from 100 to 400 nm (typically in the range from 150 to 250 nm) may be used as the gate insulating film 103. While the present embodiment employs a single-layer insulating film as the gate insulating film, a multi-layer structure consisting of two, three or more layers may be used.

The semiconductor film 104 may be an amorphous silicon film, an amorphous semiconductor film including microcrystals, a microcrystalline semiconductor film, an amorphous germanium film, an amorphous silicon germanium film expressed by $Si_xGe_{1-x}$ (0<X<1) or a multi-layer film consisting of them having a thickness in the range from 20 to 70 nm (typically in the range from 40 to 50 nm).

When the state shown in FIG. 3B is thus achieved, the semiconductor film 104 is irradiated with infrared light or ultraviolet light to be crystallized (hereinafter referred to as "laser crystallization"). In the present embodiment, the irradiation with infrared light or ultraviolet light is carried out in the atmosphere, in oxygen or in an oxidizing atmosphere to form the oxide film 105 simultaneously with the formation of the crystalline semiconductor film 106 through laser crystallization. When ultraviolet light is used for the crystallization technique, excimer laser light or intense light generated by an ultraviolet lamp may be used. When infrared light is used, infrared laser light or intense light generated by an infrared lamp may be used. Excimer laser light is shaped into linear beams to be used for irradiation according to the present embodiment. Referring to irradiating conditions, the pulse frequency is 150 Hz; the overlap ratio is in the range from 80 to 98% (actually, 96% in the present embodiment); and the laser energy density is in the range from 100 to 500 mJ/cm$^2$ and, preferably, in the range from 280 to 380 mJ/cm$^2$ (actually, 350 mJ/cm$^2$ in the present embodiment). Referring to conditions for laser crystallization (laser light wavelength, overlap ratio, irradiation intensity, pulse width, repetitive frequency, irradiation time and the like) may be appropriately determined by the person who carries out the invention in consideration to the thickness of the semiconductor film 104, the substrate temperature and the like. Depending on the conditions for laser crystallization, the semiconductor film may be crystallized after being melted, and the semiconductor film may be crystallized in a solid phase or in a state which is intermediate between solid and liquid phases without being melted. Laser light is continuously moved at a constant speed to keep the overlap ratio constant in any region with variation of ±10%.

While laser crystallization is used as the crystallizing technique in the present embodiment, other well-known means such as solid state epitaxy with and without a catalytic element. While an oxide film is formed simultaneously with laser crystallization according to the present embodiment, a step may be employed to form a thin insulating film (a silicon oxide film, silicon nitride film, silicon nitride oxide film or the like) before or after the laser irradiation or to perform laser crystallization in an inert atmosphere so as not to form an oxide film.

The step shown in FIG. 3C may be followed by a step of selectively doping the channel formation region with an impurity in order to control the threshold.

Next, the gate insulating film, crystalline semiconductor film and the oxide film are patterned to form an active layer 107 and a first protective film 108 (FIG. 3D). The patterning may be carried out after a subsequent step of doping with an impurity.

Next, a second protective film 109 constituted by a nitride film is formed on the entire surface of the substrate to protect the active layer (FIG. 3E). The second protective film 109 may be a silicon oxide film, silicon nitride film, silicon nitride oxide film (SiO$_x$N$_y$) or a multi-layer film consisting of them having a thickness in the range from 3 to 200 nm (typically in the range from 25 to 50 nm). A configuration excluding such a second protective film may be employed.

A first mask (a resist mask in the present embodiment) 110a having a thickness in the range from 1 to 3 μm is then formed in contact with the second protective film 109 over the gate line by means of exposure to light from the rear surface (FIG. 3F). Referring to the material for the first mask, a positive or negative type photosensitive organic material (e.g., photoresist, photosensitive polyimide or the like), organic resin (polyimide, polyimide amide, polyamide or the like), a silicon oxide film, a silicon nitride film or silicon nitride oxide film (SiO$_x$N$_y$) may be used.

The first mask may be formed by patterning an inorganic insulating film and leaving the patterning mask made of organic resin therefor as it is, and this provides a multi-layer structure in which the inorganic insulating film is the lower layer and the organic resin is the upper layer.

Since no mask is required for the formation of resist through exposure to light from the rear surface, the number of masks required for manufacture can be reduced. While the present embodiment has referred to an example wherein the width of the first mask in the direction of the channel length is slightly smaller than the width of the gate line because of wraparound of light, they may be substantially the same, and a person who carries out the invention may change the width of the first mask in the direction of the channel length appropriately.

The present specification is based on an assumption that the direction of departing from the substrate 100 is an upward direction and the direction of approaching the substrate is a downward direction when the substrate 100 is cut in a plane perpendicular to the surface thereof.

A first impurity is added through the first protective film 108 and second protective film 109 using the first mask 110a to form a low density impurity region (n$^-$-type region) 111 (FIG. 4A). The present embodiment employs phosphorus as the impurity to provide n-type conductivity which is adjusted such that the n$^-$type region indicated by 111 has a phosphorus density in the range from $1\times10^{15}$ to $1\times10^{17}$ atoms/cm$^3$ on the basis of SIMS analysis. At this time, the first mask is doped with phosphorus to become a first mask 110b containing a low density of phosphorus.

Next, a second mask (made of photosensitive polyimide resin in the present embodiment) 113a having a thickness in the range from 1 to 3 μm is formed in contact with the second protective film 109 or first mask 110b of the n-channel type TFT (FIG. 4B). Referring to the material for the second mask, a positive or negative type photosensitive organic material (e.g., resist, photosensitive polyimide or the like), organic resin (polyimide, polyimide amide, polyamide or the like), a silicon oxide film, a silicon nitride film or silicon nitride oxide film (SiO$_x$N$_y$) may be used.

A second impurity is added to form a high density impurity region (n$_+$-region) 114 through the first protective film 108 and second protective film 109 using the second mask 113a (FIG. 4C). In the present embodiment, the second mask is patterned into a desired configuration to allow an LDD region to be formed with high controllability. In the present embodiment, an adjustment is made such that the n$^+$-type region indicated by 114 has a phosphorus density in the range from $1\times10^{20}$ to $8\times10^{21}$ atoms/cm$^3$ on the basis of SIMS analysis. A first mask 110c of the p-channel type TFT is doped with a high density of phosphorus. A second mask 113b is similarly doped with a high density of phosphorus. A first mask 110b and a second mask 113b at the channel formation region of the n-channel type TFT prevent the channel formation region from being doped with phosphorus.

The first and second steps of doping with impurities form an LDD structure. The boundary between the n$^-$-type and n$^+$-type regions is determined by the pattern of the second mask. The n$^+$-type region 114 of the n-channel type TFT serves as a source or drain region, and the n$^-$-type region serves as a low density impurity region (LDD region) 115.

At the first and second steps of doping with impurities, the first masks 110b and 110c and the second mask 113b doped with phosphorus are darkened. A step may be added to darken the first masks and the second mask further.

Next, the n-channel type TFT is covered with a third mask 116 and is doped with a third impurity through the first and second protective films 108 and 109, thereby forming a high density impurity region (p-type region) 117 (FIG. 4D). In the present embodiment, boron is used as an impurity to provide p-type conductivity, and the dose of boron is set such that the density of boron ions in the p-type region is greater than the density of the phosphorus ions added to the n$^+$-type region by a factor in the range from about 1.3 to 2. A first mask 110d of the p-channel type TFT is doped with boron at a high density. Similarly, a third mask 116 is doped with boron. The first, second and third masks, i.e., organic resin, include a trivalent impurity (boron in this embodiment) or a pentavalent impurity (phosphorus in this embodiment) at a density of 1×10$^{19}$ atoms/cm$^3$ or more. The p-type region 117 of the p-channel type TFT serves as a source or drain region. The region which has been doped with neither phosphorus ions nor boron ions becomes an intrinsic or substantially intrinsic channel forming region 112 to serve as a carrier moving path later.

In the context of the present specification, an intrinsic region is a region which does not include any impurity that can cause the Fermi level of silicon, and a substantially intrinsic region is a region in which electrons and holes are perfectly balanced to cause conductivity types to cancel each other, i.e., a region including an impurity to provide the n-type or p-type conductivity at a density range in which threshold control is possible (in the range from 1×10$^{15}$ to 1×10$^{17}$ atoms/cm$^3$ on the basis of SIMS analysis) or a region which is intentionally doped with opposite conductivity type impurity to cause the conductivity types to cancel each other.

The doping with the first through third impurities may be carried out using well-known means such as ion implantation, plasma doping and laser doping. The doping conditions, dose, acceleration voltage and the like are adjusted such that a desired amount of impurity ions penetrate through the first protective film 108 and the second protective film 109 to be added to a predetermined region of the active layer.

Further, no contaminant especially boron enters the active layer from the atmosphere because impurities are implanted from above the second protective film 109 at the first, second and third steps of doping with impurities. Since it is therefore possible to control the density of the impurities in the active layer, fluctuation of the threshold can be suppressed.

After the high density impurity region 117 to serve as a source or drain region is thus formed, only the third mask 116 is selectively removed. The selective removing step may be implemented by using a material different from that for the first and second masks for the third mask. The first and second protective films 108 and 109 serve as an etching stopper at this mask removing step. No contaminant enters the crystalline semiconductor film especially the channel formation region 112 at this mask removing step because the first and second protective films have been formed.

A well-known technique, e.g., thermal annealing or laser annealing is then performed to achieve the effect of activating the impurity in the source and drain regions or the effect of recovering the crystal structure of the active layer which has been damaged at the doping step.

Finally, a layer insulating film 118 is formed which is made of organic resin such as polyimide, polyimideamide, polyamide or acrylic or constituted by a silicon oxide film, a silicon nitride film, a silicon nitride oxide film (expressed by (SiO$_x$N$_y$) or a multi-layer film consisting of them; contact holes are formed to expose the source and drain regions; and, thereafter, a metal film is formed and patterned to form metal lines 119 through 123 in contact with the source and drain regions (FIG. 4E). This completes the manufacture of a CMOS circuit portion formed by n-channel type and p-channel TFTs and a pixel matrix circuit portion formed by n-channel type TFTs according to a mode for carrying out the invention.

A description will now be made with reference to FIG. 1 on a configuration of a semiconductor device including a semiconductor circuit utilizing semiconductor elements formed according to the above-described manufacture steps. In the present embodiment, for simplicity, the illustration shows only a CMOS circuit portion forming a part of a peripheral driving circuit portion and pixel TFTs (n-channel type TFTs) forming a part of a pixel matrix circuit portion on the same substrate.

Figure 2A:
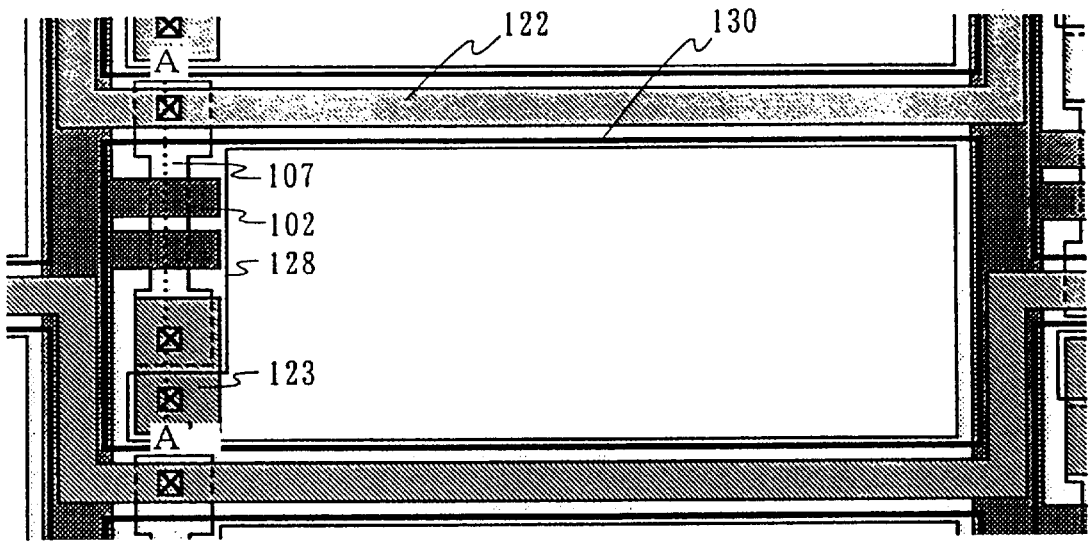
FIGS. 2A and 2B are plan views of a pixel matrix circuit and a CMOS circuit of the first embodiment.
Figure 2B:
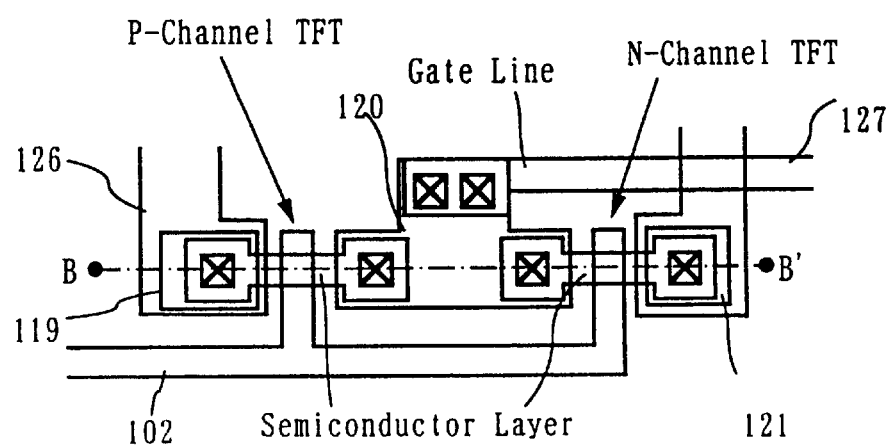

FIGS. 2A and 2B are plan views associated with FIG. 1. In FIGS. 2A and 2B, the section cut along the dotted line A–A' corresponds to the sectional structure of the pixel matrix circuit portion in FIG. 1, and the section cut along the dotted line B–B' corresponds to the sectional structure of the CMOS circuit portion in FIG. 1. The reference numbers used in FIGS. 1, 2A and 2B are the same as those used in FIGS. 3A through 3F and FIGS. 4A through 4E. For simplicity of illustration, FIGS. 2A and 2B do not show the first and second masks.

In FIG. 1, all of the TFTs (thin film transistors) are formed on the underlying film 101 provided on the substrate 100. For the p-channel type TFT in the CMOS circuit, the gate line 102 is formed on the underlying film, and the gate insulating film 103 is provided on the same. The p-type region 117 (source or drain region) and the channel formation region 112 are formed as active layers on the gate insulating film. The active layers are protected by the first protective film 108 and the second protective film 109 which have the same pattern. Contact holes are formed on the first layer insulating film 118 made of organic resin covering the second protective film 109 to connect the lines 119 and 120 to the p-type region 117. A second layer insulating film 125 is formed thereon; an extraction line 126 is connected to the line 119 and a third layer insulating film 129 is formed thereon to cover the same. The first mask 110d having light blocking properties is formed on the second protective film over the channel formation region to protect the channel formation region from deterioration. The first mask 110d is doped with a trivalent impurity (boron in the present embodiment) and a pentavalent impurity (phosphorus in this embodiment) at a density of 1×10$^{19}$ atoms/cm$^3$ or more.

The n-channel type TFT is formed with the n$^+$-type regions 114 (source or drain region) as active layers, the channel formation region 112 and the n$^-$-type region (LDD region) 115 between the n$^+$-type region (drain region) and the channel formation region. The lines 120 and 121 are respectively formed in the drain region and source region among the n$^+$-type regions 114, and the lead line 127 is further connected to the line 121. Its structure is substantially the same as that of the p-channel type TFT in regions other than the active layer. The first masks (110b and 110c) are formed at least on the second protective film over the channel formation region 112, and a second mask 113b having light blocking properties is formed on the second protective film over the drain region which is one of the n$^-$-type regions 114 to protect the channel formation region and the n$^-$-type regions from the deterioration of light.

The n-channel type TFTs formed in the pixel matrix circuit have the same structure as that of the n-channel TFT of the CMOS circuit up to the region where the gate insulating film 103 is formed. In the n-channel type TFTs formed in the pixel matrix circuit, since deteriorating phenomena such as hot carrier implantation can occur between the n+-type regions 114 and the channel formation regions 112 connected to the lines 122 and 123, the n−-type regions (LDD regions) 115 are formed between the n+-type regions and channel formation regions connected to the lines, and no n−-type region (LDD region) is provided between adjoining channel formation regions. The first and second masks used to form the n−-type regions (LDD regions) 115 are left as they are to be used as light-blocking films. The second layer insulating film 125 and a black mask 128 are formed on the first layer insulating film 118 with the lines 122 and 123 formed thereon. The third layer insulating film 129 is formed thereon, and a pixel electrode 130 constituted by a transparent conductive film made of ITO, $SnO_2$ or the like is connected to the same. The black mask covers the pixel TFTs and cooperates with the pixel electrode 130 to form an auxiliary capacity.

In the present embodiment, since a resist mask is formed through exposure to light at the rear surface, a mask is provided over the gate line to reduce any capacity that the gate line forms with the lines.

While a transmission type LCD is manufactured as an example in the present embodiment, the invention is not limited thereto. For example, a reflective metal material may be used as the material for the pixel electrode, and a reflection type LCD may be manufactured by changing the patterning of the pixel electrode or adding and deleting several steps appropriately.

While the gate lines of the pixel TFTs of the pixel matrix circuit have a double gate structure in the present embodiment, a multi-gate structure such as a triple gate structure may be used to reduce variation of the off-current. A single gate structure may be used to improve the numerical aperture.

A second embodiment will now be described. The present embodiment is an example in which a crystalline semiconductor film is obtained using a method different from that in the first embodiment. In the present embodiment, a step is added between the steps shown in FIGS. 3B and 3C of the first embodiment to cause a catalytic element for promoting crystallization to be carried on the entire surface of the semiconductor film or to be selectively carried. Since the present embodiment is substantially the same as the first embodiment in the basic configuration, the following description will address only differences between them.

The present embodiment is identical to the first embodiment up to the step of forming the semiconductor film 104 (FIG. 3B).

According to the present embodiment, a catalytic element for promoting the crystallization of silicon is introduced on the surface of the semiconductor film 104. As the catalytic element for promoting the crystallization of silicon, one or a plurality of elements selected from among Ni, Fe, Co, Pt, Cu, Au and Ge are used. In the present embodiment, Ni is used among the catalytic elements because of its high speed in spreading in an amorphous silicon film and its excellent crystallinity.

The introduction of the catalytic element is not limited to any particular locations, and the element is introduced on the entire surface of the amorphous silicon film or selectively on the surface by forming a mask appropriately. A step may be employed to introduce the catalytic element on the rear surface of the amorphous silicon film or on both of the front and rear surfaces.

There is no limitation on the method for introducing a catalytic element to the amorphous silicon film as long as it allows the catalytic element to be put in contact with the surface of the amorphous silicon film or it allows the catalytic element to be retained in the amorphous silicon film. For example, it is possible to adopt sputtering, CVD, plasma processing, absorption, ion implantation or a method of applying a solution including a catalytic element. The method utilizing a solution is easy to implement and is advantageous in that the density of a catalytic element can be easily adjusted. Various salts may be used as the metallic salt, and usable solvents other than water include alcohols, aldehydes, ethers, other organic solvents or solvents obtained by mixing water and organic solvents. In the present embodiment, the method of applying a solution is used to apply a solution including nickel in the range from 10 to 10000 ppm and, preferably, in the range from 100 to 10000 ppm (by weight). The dose must be adjusted appropriately in consideration to the thickness of the amorphous silicon film. The density of nickel in the amorphous silicon film thus obtained is in the range from $1\times10^{19}$ to $1\times10^{21}$ atoms/$cm^3$.

After a catalytic element is introduced into the amorphous silicon film as described above, crystallization is conducted by irradiating the film with laser light to obtain a crystalline silicon film. A heating step at a high temperature may be added in place of the irradiation with laser light. A gettering step maybe added to reduce the number of catalytic elements in the film.

Subsequent steps provide a semiconductor device as shown in FIG. 1 according to the first embodiment.

A third embodiment of the invention will now be described. The present invention is an example in which a crystalline semiconductor film is obtained using a method different from that for the first embodiment. In the present embodiment relates to a method wherein laser beams are shaped into a rectangular or square configuration to perform a uniform laser crystallization process throughout an area in the range from several $cm^2$ to several hundred $cm^2$ with irradiation at one time, thereby providing a crystalline silicon film. Since this embodiment is substantially the same as the first embodiment in its basic configuration, the description will address only differences between them.

According to the present embodiment, irradiation is conducted with excimer laser light which is processed into a planar configuration at the step shown in FIG. 3C. The laser light must be processed into a planar configuration such that an area on the order of several tens $cm^2$ (preferably 10 $cm^2$) or more can be irradiated at a time. In order to anneal the irradiated surface as a whole with a desired laser energy density, a laser apparatus that provides output having total energy of 5 J or more and preferably 10 J or more is used.

In this case, the energy density is in the range from 100 to 800 mJ/$cm^2$, and the output pulse width is 100 nsec. or more and is preferably in the range from 200 nsec. to 1 msec. A pulse width in the range from 200 nsec. to 1 msec. can be achieved by connecting a plurality of laser devices and by operating the laser devices asynchronously to achieve a state of mixture of a plurality of pulses.

The use of laser light having a planar beam configuration as in the present embodiment makes it possible to irradiate a large area with uniform laser light. That is, the active layer will have uniform crystallinity (in terms of also grain size and defect density), and variation of electrical characteristics of TFTs can be reduced.

The present embodiment can be easily combined with the first or second embodiment in flexible modes of combination.

A fourth embodiment of the invention will now be described. The present embodiment is an example wherein an insulating film and a crystalline semiconductor film are obtained using a method different from that of the first embodiment.

According to the present embodiment, a silicon nitride oxide film having a thickness of 125 nm as a gate insulating film, an amorphous silicon film having a thickness of 50 nm as an initial semiconductor film and a silicon nitride oxide film having a thickness of 15 nm as an insulating film are formed into a multi-layer configuration without being exposed to the atmosphere. Obviously, the thickness of each film is not limited to the present embodiment and may be appropriately determined by a person who carries out the invention. A configuration may also be employed in which a multiplicity of layers are formed by replacing reactive gasses in the same chamber. Active hydrogen or a hydride is preferably used on the surface on which the film is to be formed before the initial semiconductor film is formed to reduce contaminant.

Thereafter, the initial semiconductor film is irradiated with infrared light or ultraviolet light to be crystallized (hereinafter referred to as "laser crystallization"). In the present embodiment, excimer laser light is shaped into linear beams to be used for irradiation. Referring to irradiating conditions, the pulse frequency is 150 Hz; the overlap ratio is in the range from 80 to 98% (96% in the present embodiment); and the laser energy density is in the range from 100 to 500 mJ/cm$^2$ and, preferably, in the range from 150 to 200 mJ/cm$^2$ (175 mJ/cm$^2$ in the present embodiment). Referring to conditions for laser crystallization (laser light wavelength, overlap ratio, irradiation intensity, pulse width, repetitive frequency, irradiation time and the like) may be appropriately determined by the person who carries out the invention in consideration to the thickness of the insulating film, the thickness of the initial semiconductor film, the substrate temperature and the like.

This step crystallizes the initial semiconductor film to be transformed into a crystalline semiconductor film (a semiconductor film including crystals). In the context of the present embodiment, a crystalline semiconductor film is a polycrystalline silicon film. At this step, no contaminant enters the initial semiconductor film from the atmosphere because the laser light is projected through the insulating film. That is, the initial semiconductor film can be crystallized with the interface of the initial semiconductor film kept clean.

Thus, substantially the same state as that shown in FIG. 3C is achieved. Subsequent steps (in FIG. 3D and later drawings) complete a semiconductor device as shown in FIG. 1 according to the first embodiment. The present embodiment can be easily combined with the first or third embodiment in flexible modes of combination.

A fifth embodiment of the invention will now be described, The present embodiment refers to an example of the manufacture of a TFT having a structure different from that in the first embodiment with reference to FIG. 5. Plan views of FIG. 5 will correspond to FIGS. 2A and 2B.

According to the present embodiment, a multi-layer structure is provided in which an upper layer is constituted by a plastic substrate as a substrate 500, silicon nitride oxide (expressed by (SiO$_x$N$_y$) as an underlying film 501 and a film made of a material mainly composed of copper (Cu) as a gate line and in which a lower layer is constituted by a film made of a material mainly composed of tantalum.

Next, a film made of an organic material, e.g., BCB (benzocyclobutene) for flattening irregularities between regions having gate lines and regions having no gate line is formed to a thickness in the range from 100 nm to 1 μm (preferably in the range from 500 to 800 nm) as a first insulating film 503. This step must provide a film thickness sufficient to flatten any step attributable to gate lines completely. Since a BCB film has a significant flattening effect, it can provide a sufficient flatness with a not so large thickness.

After the first insulating film 503 is formed, a second insulating film (silicon nitride oxide film) 504, an initial semiconductor film (microcrystalline silicon film) and an insulating film (silicon nitride oxide film) to serve as a protective film 509 are sequentially formed into layers without exposing them to the atmosphere. The microcrystalline silicon film is formed at a temperature in the range from 80 to 300° C. and preferably in the range from 140 to 200° C. and with silane gas diluted by hydrogen (SiH$_4$: H$_2$ =1:10 to 100) as the reactive gas, a gas pressure in the range from 0.1 to 10 Torr and discharge power in the range from 10 to 300 mW/cm$^2$. Since the hydrogen density in the microcrystalline silicon film is low, the use of the same as the initial semiconductor film makes it possible to delete a thermal process to reduce the hydrogen density. In the present embodiment, separate chambers exclusively used for the second insulating film, initial semiconductor film and protective film are prepared, and the films are continuously formed while the substrate is moved through the chambers without being exposed to the atmosphere. The insulating film and semiconductor film thus formed continuously are flat because they are formed on the flat surface.

Then, excimer laser light is projected upon the protective film to modify the semiconductor film into a semiconductor film including crystals (polycrystalline silicon film). Conditions for this laser crystallization may be the same as those in the fourth embodiment. At this time, since the semiconductor film is flat, a polycrystalline silicon film having a uniform grain size can be obtained. Intense light, e.g., RTA or RTP may be used for irradiation instead of laser light.

Since a BCB film which can be easily flattened is used as the first insulating film 503, a semiconductor film having a flat surface can be provided. This makes it possible to maintain uniform crystallinity throughout the semiconductor film.

Figure 5:
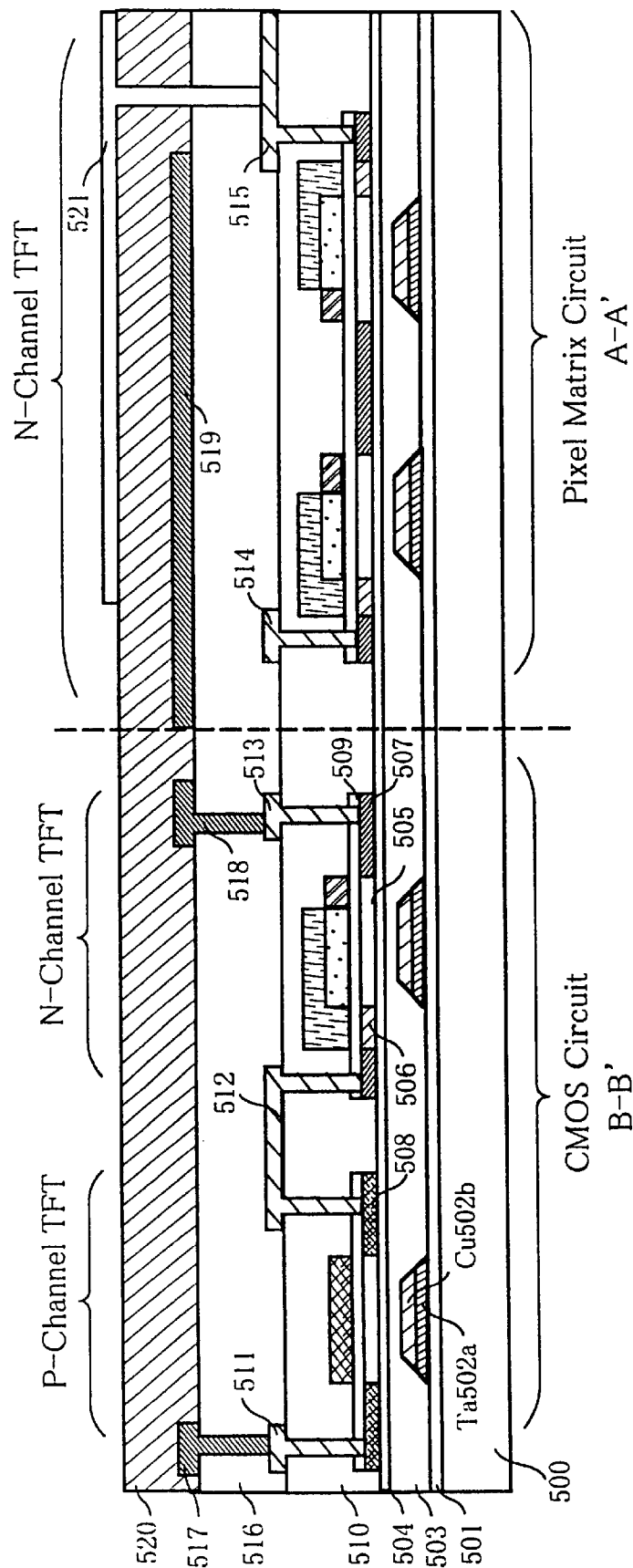
FIG. 5 is a sectional view showing another example of a structure of a semiconductor device according to a fifth embodiment of the invention.

Subsequent steps complete a semiconductor device as shown in, for example, FIG. 5 according to the first embodiment, although there is a slight difference in the design of the second mask.

Referring to FIG. 5, all TFTs (thin film transistors) are formed on an underlying layer 501 provided on a substrate 500. For a p-channel type TFT of a CMOS circuit, gate lines 502a and 502b are formed on the underlying layer, and a first insulating film 503 and a second insulating film 504 made of BCB are provided thereon. A p-type region 508 (source or drain region) and a channel formation region 505 as active layers are formed on the second insulating film. The active layers are protected by a protective film 509 having the same configuration. A contact hole is formed through a first layer insulating film 510 covering the protective film 509 to connect lines 511 and 512 to the p-type region 508. A second layer insulating film 516 is further formed thereon; an extraction line 517 is connected to the line 511; and a third layer insulating film 520 is formed to cover the same. A first mask having light blocking properties is formed at least on the protective film over the channel formation region to protect the channel formation region from deterioration attributable to light.

Referring to the n-channel type TFT, an n⁺-type region 507 (source or drain region), channel formation region 505 and an n⁻-type region 506 between the n⁺-type region and channel formation region are formed as active layers. The n⁺-type region 507 is formed with lines 512 and 513, and an extraction line 518 is connected to the line 513. Regions other than the active layers have substantially the same structure as that of the p-channel TFT. A first mask having light blocking properties is formed at least on the protective film over the channel formation region 505 and a second mask is formed on the protective film over the n⁻-type region 506 to protect the channel formation region and n⁻-type region from deterioration attributable to light.

Referring to n-channel type TFTs formed in the pixel matrix circuit, lines 514 and 515 are connected to n⁺-type regions 507, and a second layer insulating film 516 and a black mask 519 are formed thereon. The black mask covers the pixel TFTs and forms an auxiliary capacity in cooperation with the line 515. Further, a third layer insulating film 520 is formed therein, and a pixel electrode 521 constituted by a transparent conductive film such as ITO is connected thereto.

The pixel matrix circuit of the present embodiment has a TFT structure in which a line capacity generated between the gate line 502 and the lines 514 and 515 is reduced by the first and second masks. According to the embodiment, a capacity between lines is reduced not only in the pixel matrix circuit but also in other regions by the masks are provided over the gate line because the resist masks are formed through exposure to light at the rear surface.

TFTs manufactured according to the present embodiment exhibit electrical characteristics with less variation. The present embodiment can be combined with the first, second, third or fourth embodiment.

A sixth embodiment of the present invention will now be described. In the present embodiment, a description will be made with reference to FIG. 6 on an example of the manufacture of a TFT having a structure different from that in the first embodiment. The configuration of the CMOS circuit will be described only in areas of difference because it is substantially the same as that in the first embodiment. Plan views of FIG. 6 correspond to FIGS. 2A and 2B.

The present embodiment is the same as the first embodiment up to the formation of a glass substrate as a substrate, a silicon nitride oxide film ($SiO^xN_y$) as an underlying film and a gate line.

According to the present embodiment, a first insulating film 601 is then selectively formed in the pixel matrix circuit.

Thereafter, a second insulating film (which corresponds to the gate insulating film in the first embodiment) and an initial semiconductor film are sequentially formed into a multiplicity of layers without exposing them to the atmosphere just as in the first embodiment. In the present embodiment, a silicon nitride oxide film having a thickness in the range from 10 to 100 nm as a second insulating film 602 and an amorphous silicon film having a thickness of 50 nm as an initial semiconductor film are formed into a multiplicity of layers using plasma CVD in the same chamber with a high degree of vacuum maintained therein. Obviously, the thickness of each of the films is not limited to the present embodiment and may be appropriately determined by a person who carries out the invention. According to the present embodiment, the gate insulating films (first insulating film 601 and second insulating film 602) of the pixel matrix circuit are formed to provide a total thickness in the range from 100 to 300 nm.

Figure 6:
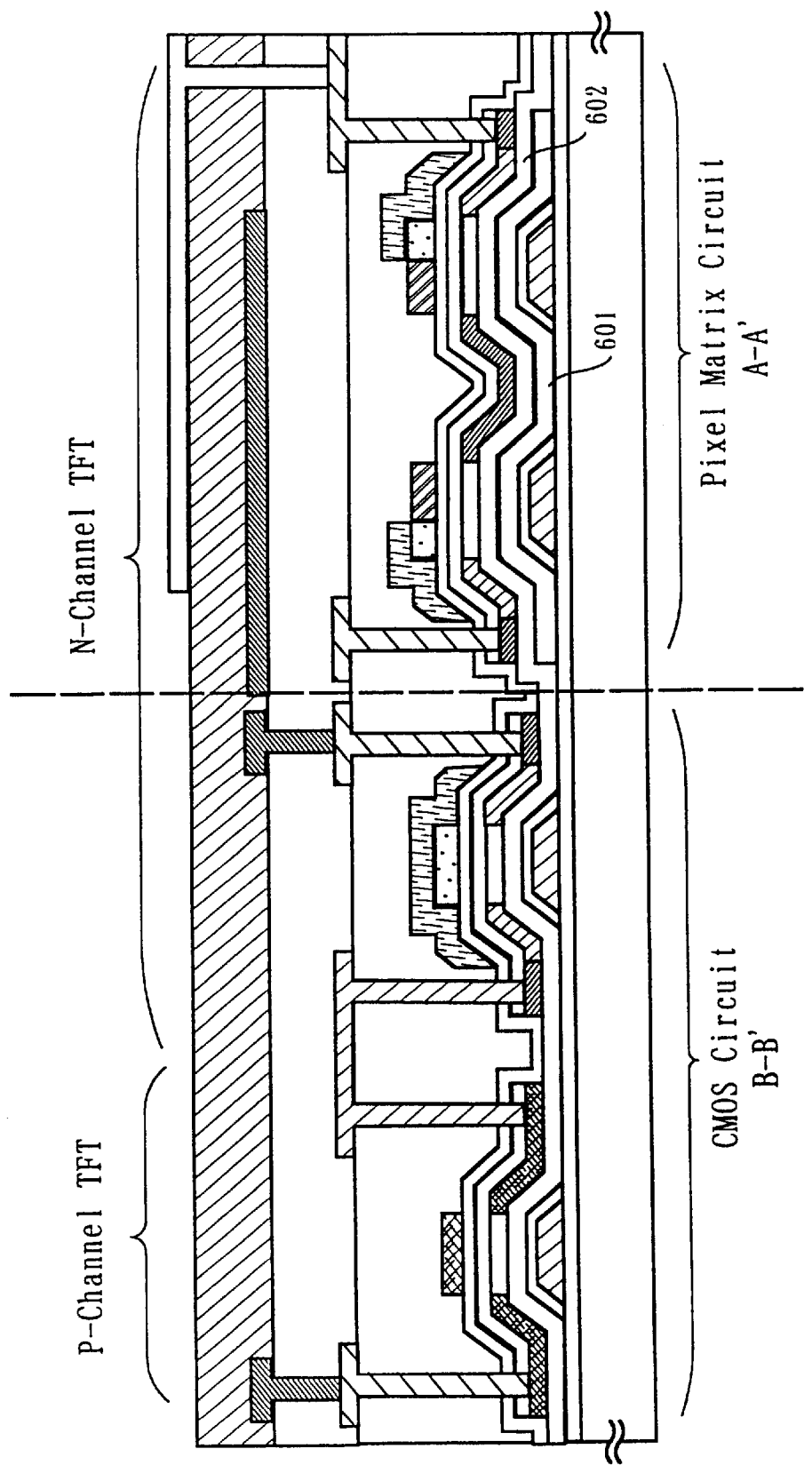
FIG. 6 is a sectional view showing another example of a structure of a semiconductor device according to a sixth embodiment of the invention.

Description will be omitted for the CMOS circuit in FIG. 6 because it has substantially the same configuration as that in the first embodiment. The n-channel type TFTs formed in the pixel matrix circuit have substantially the same as those in FIG. 1 according to the first embodiment except that the gate insulating film has a two-layer structure (first insulating film 601 and second insulating film 602). By selectively increasing the thickness of the gate insulating films as described above, reliability of circuits which must have a high withstand voltage (pixel matrix circuit, buffer circuit and the like) is improved.

The pixel matrix circuit of the present embodiment has a TFT structure in which a line capacity generated between the gate line and other lines is reduced by a first and second masks just as in the first embodiment. According to the embodiment, a capacity between lines is reduced not only in the pixel matrix circuit but also in other regions by the masks are provided over the gate line because the resist masks are formed through exposure to light at the rear surface.

TFTs manufactured according to the present embodiment exhibit electrical characteristics with less variation. The present embodiment can be combined with any of the first through fifth embodiments.

A seventh embodiment of the present invention will now be described. In the present embodiment, a description will be made with reference to FIGS. 7A, 7B and 7C on an example of the manufacture of a pixel matrix circuit portion having a structure different from that in the first embodiment. While the gate lines of the pixel TFTs in the pixel matrix circuit portion of the first embodiment have a double gate structure, the present embodiment refers to an example wherein a triple gate structure is employed to reduce variation of the off-current.

Figure 7A:
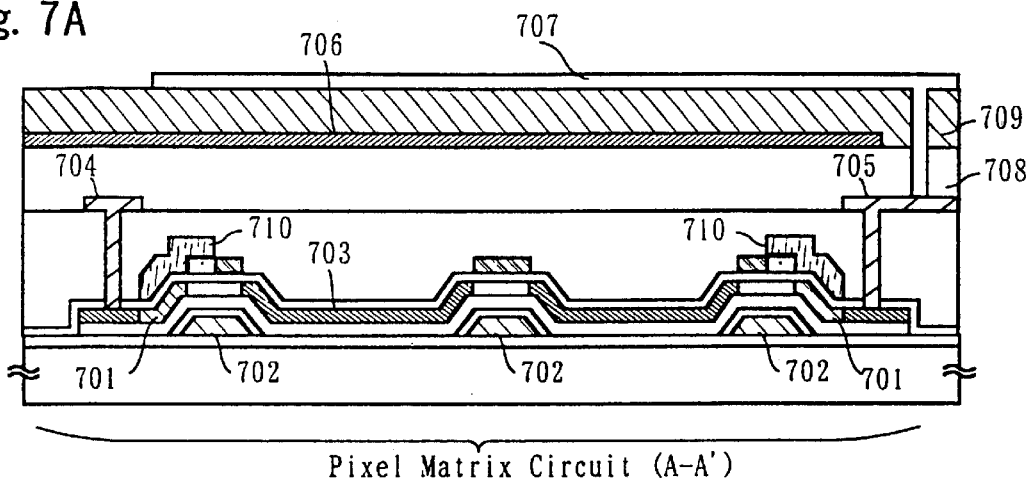
FIGS. 7A and 7B are sectional views of an example of a pixel matrix circuit portion according to a seventh embodiment of the invention.
Figure 7B:
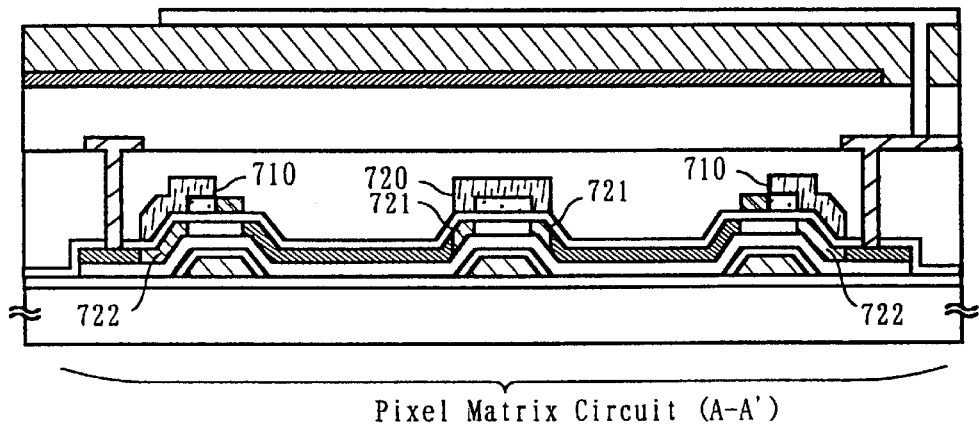
Figure 7C:
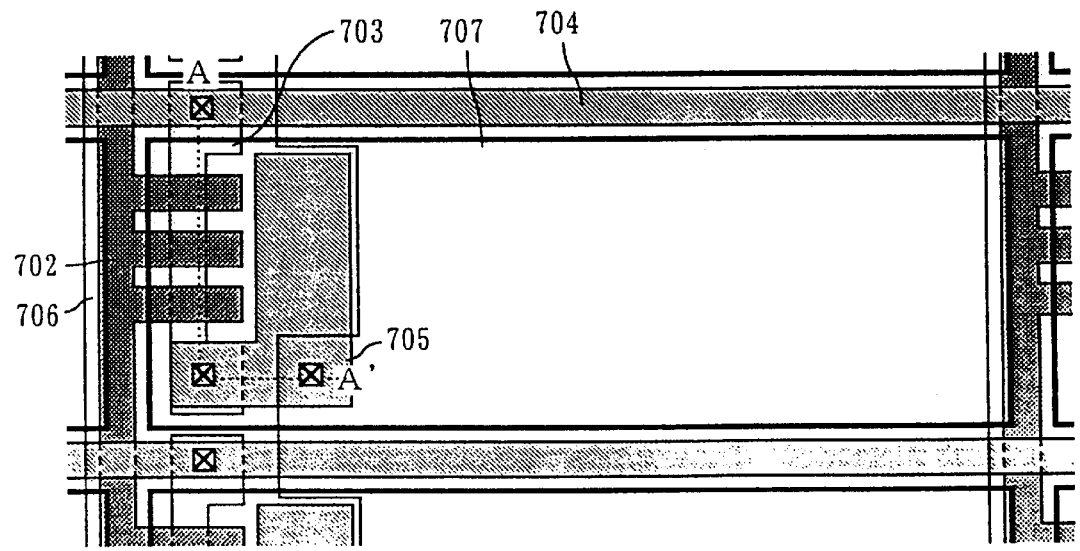
FIG. 7C is a plan view of the same.

FIG. 7C is a plan view showing an example of the triple gate structure. FIG. 7A shows an example of the section taken along the dotted line A–A' in FIG. 7C.

In FIG. 7A, 701 represents an n-type region (LDD region); 702 represents gate lines; 703 represents an n⁺-type region; 704 and 705 represent lines; 706 represents a black mask; 707 represents a pixel electrode; 708 and 709 represent layer insulating films; and 710 represents a second mask. This configuration is characterized in that the LDD region (with a width in the direction of the channel length in the range from 0.5 to 3 µm, typically in the range from 1 to 2 µm) is provided only in a region where it is required. According to the prior art, especially the self-alignment method, unnecessary LDD regions have been formed between adjoining channel formation regions.

The present embodiment may be formed as an application of the first embodiment. The sectional structure shown in FIG. 7A especially the n⁻-type region (LDD region) and n⁺-type region can be easily formed by modifying the pattern of the second mask of the first embodiment.

Further, the use of a pattern of the second mask different from that in FIG. 7A makes it possible to obtain a different with of the LDD region as shown in FIG. 7B without any increase in the number of steps. FIG. 7B is substantially the same as FIG. 7A except that a first n⁻-type region 722 having a greater width in the direction of the channel length of the LDD region and a second n⁻-type region 721 having a smaller width in the direction of the channel length of the LDD region are selectively formed. The width of the first n⁻-type region 722 in the direction of the channel length is in the range from 0.5 to 3 µm and typically in the range from 1 to 2 µm. and the width of the second n⁻-type region 721 in the direction of the channel length is in the range from 0.3 to 2 μm and typically in the range from 0.3 to 0.7 μm. The width of each of the n⁻-type regions in the direction of the channel length can be freely adjusted by the design of the mask. Therefore, the widths of the n⁻-type regions in the direction of the channel length may be appropriately determined by a person who carries out the invention depending on requirements associated with the circuit configuration.

TFTs manufactured according to the present embodiment exhibit electrical characteristics with less variation. The present embodiment can be combined with any of the first through sixth embodiments.

An eighth embodiment of the present invention will now be described. In the present embodiment, a description will be made with reference to FIGS. 8A, 8B and 8C on an example of the circuit configuration of the CMOS circuit (inverter circuit) shown in the first embodiment. Terminal portions a, b, c and d in the inverter circuit diagram and the plan view of the inverter circuit in FIG. 8A correspond to each other.

Figure 8A:
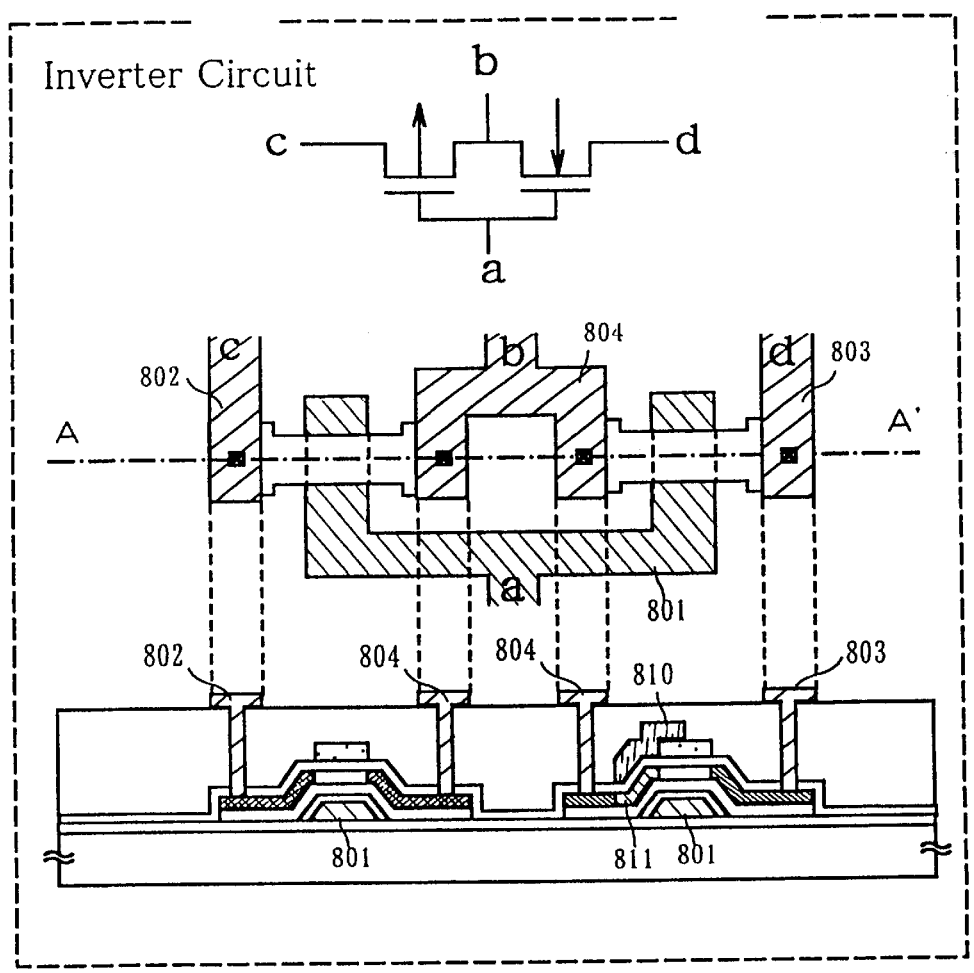
FIGS. 8A, 8B and 8C are a circuit diagram of an inverter, a plan view of the same and sectional views of examples of sectional structures of the same according to an eighth embodiment of the invention.

The sectional structure along the line A–A' of the inverter circuit in FIG. 8A is the same as that shown in FIG. 1. Therefore, the structure shown in FIG. 8A can be provided according to the first embodiment. This circuit is formed by gate lines 801, a source electrode 802 of a p-channel type TFT, a source electrode 803 of an n-channel type TFT and a common drain electrode 804.

Figure 8B:
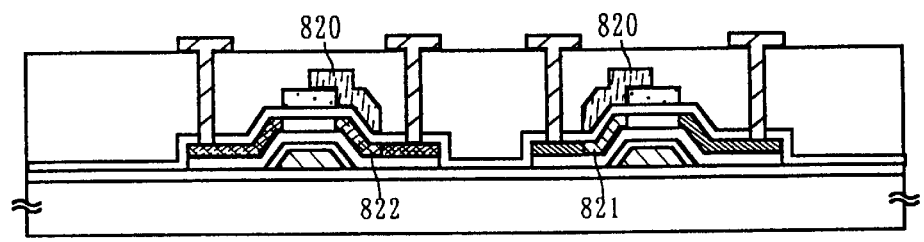

FIG. 8B shows a sectional structure of the inverter circuit different from the sectional structure along the line A–A' in FIG. 8A. To provide the structure shown in FIG. 8B, the pattern of a second mask 810 as in the first embodiment is modified to form a second mask 820 also in the p-channel type TFT, thereby forming a p⁻-type region 822 doped with boron at a low density and an n⁻-type region 821. A mask for achieving a low boron density is required to provide the structure shown in FIG. 8B.

Figure 8C:
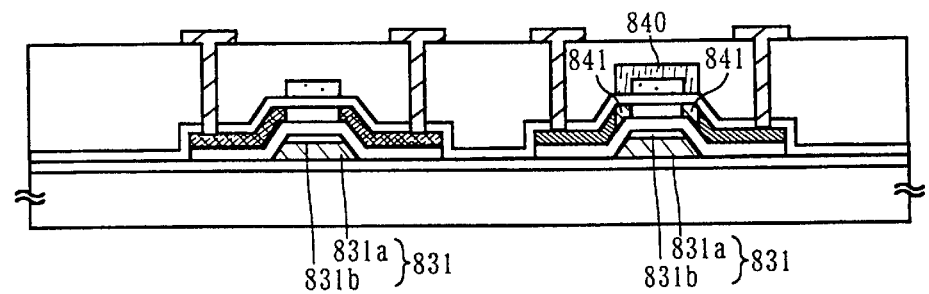

FIG. 8C shows a sectional structure of the inverter circuit different from the sectional structure along the line A–A' in FIG. 8A. To provide the structure shown in FIG. 8C, the pattern of the second mask 810 as in the first embodiment is modified to form a second mask 840, thereby forming n⁻-type regions 841 on both sides of the channel formation region. The width of each of the n⁻-type regions in the direction of the channel length can be freely adjusted through designing of the mask. Therefore, the width of the n⁻-type regions in the direction of the channel length may be appropriately determined by a person who carries out the invention according to requirements associated with the circuit configuration. Gate lines 831 are patterned after forming a tantalum film and thereafter forming an anodic film on the surface thereof to reduce the number of masks.

The structures shown in FIGS. 8A and 8B can be simultaneously fabricated on the same substrate without increasing the number of steps. The present invention makes it possible to form n⁻-type regions or p⁻-type regions having various widths (in the direction of the channel length) on the same substrate. For example, it is possible to simultaneously fabricate a TFT having an n⁻-type regions on both sides of the channel formation region, a TFT having an n-type region on one side of the channel formation region, a TFT having n⁻-type regions with different widths in the direction of the channel length on both sides of the channel formation region, a TFT having no n⁻type region on both sides of the channel formation region and the like on the same substrate without increasing the number of steps.

The present embodiment may be combined with any of the first through sixth embodiments.

A ninth embodiment of the present invention will now be described. In the present embodiment, a description will be made with reference to FIG. 9 on an example of a configuration of a buffer circuit utilizing bottom-gate type TFTs shown in the first through sixth embodiments. The CMOS circuit is formed as a complementary combination of an n-channel type TFT and a p-channel type TFT formed on the same substrate. Terminal portions a, b, c and d in the buffer circuit diagram and the sectional structure view of the buffer circuit in FIG. 9 correspond to each other.

In the buffer circuit, as illustrated, an n⁻-type region is preferably formed at least one side (the side of an output line terminal b) of the channel formation region of the n-channel type TFT. To obtain the structure shown in FIG. 9, the pattern of the second mask 113 of the first embodiment is modified to form a second mask 910, thereby forming an n⁻-type region 901 on one side of the channel formation region.

The present embodiment can be combined with any one of the first through sixth embodiments.

A tenth embodiment of the present invention will now be described. In the present embodiment, an example of a liquid crystal display manufactured according to the invention will be described with reference to FIG. 10. Detailed description will be omitted for the method of manufacturing the pixel TFTs (pixel switching elements) and the step for cell assembly because they may be carried out using well-known means.

Figure 10:
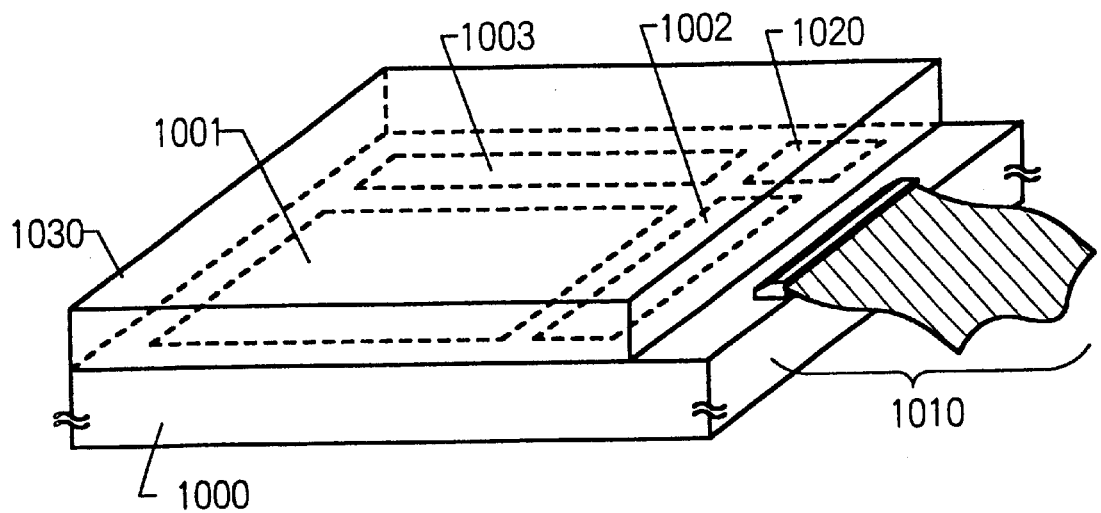
FIG. 10 illustrates a configuration of a semiconductor device (liquid crystal display) according to a tenth embodiment of the invention.

In FIG. 10, 1000 represents a substrate having an insulated surface (a glass substrate having a silicon oxide film provided thereon); 1001 represents a pixel matrix circuit; 1002 represents a scan line driving circuit; 1003 represents a signal line driving circuit; 1030 represents a counter substrate; 1010 represents an FPC (flexible printed circuit); and 1020 represents a logic circuit. The logic circuit 1020 may be formed as a circuit such as a D–A converter, gamma correction circuit or signal division circuit having functions which have been conventionally substituted by an IC. Obviously, an IC chip may be provided on the substrate to perform signal processing on the IC chip.

While the present embodiment refers to a liquid crystal display as an example, the present invention may obviously be applied to any active matrix type display such as an EL (electro-luminescence) display or EC (electro-chromics) display.

The present invention may be applied to the manufacture of any liquid crystal display whether it is of the transmission type or reflection type. A person who carries out the invention may choose either of them at his or her own choice. Thus, the invention may be any active matrix type electro-optical device (semiconductor device).

The configuration of any of the first through ninth embodiments may be used to manufacture a semiconductor device as described in the present embodiment, and any combination of those embodiments may be used.

An eleventh embodiment of the invention will now be described. The invention may be applied to conventional IC techniques in general. That is, the invention may be applied to all semiconductor circuits currently available on the market. For example, it may be applied to microprocessors such as RISC processors and ASIC processors integrated on one chip and may be applied to signal processing circuits represented by driver circuits for liquid crystal (D–A converters, gamma correction circuits, signal division circuits and the like) and to high frequency circuits for portable devices (potable telephones, PHS and mobile computers).

Semiconductor circuits such as microprocessors are loaded on various electronic equipments to function as a key circuit. Typical electronic equipment include personal computers, personal digital assistants and all other electronic equipment for home use. Computers for controlling vehicles (automobiles, trains and the like) are also included. The invention may be applied to semiconductor devices for such purposes.

The configuration of any of the first through ninth embodiments may be used to manufacture a semiconductor device as described in the present embodiment, and any combination of those embodiments may be used.

A twelfth embodiment of the invention will now be described. A CMOS circuit and a pixel matrix circuit formed according to the invention may be used in various electro-optical devices (active matrix type liquid crystal displays, active matrix type EL displays and active matrix type EC displays). That is, the invention may be applied to any electronic equipment incorporating such electro-optical devices as display media.

Such electronic equipments include video cameras, digital cameras, (rear type or front type) projectors, head-mount displays (goggle type displays), car navigation systems, personal computers and personal digital assistants (mobile computers, portable telephones, electronic books and the like). FIGS. 11A through 11F and FIGS. 12A through 12D show examples of such devices.

Figure 11A:
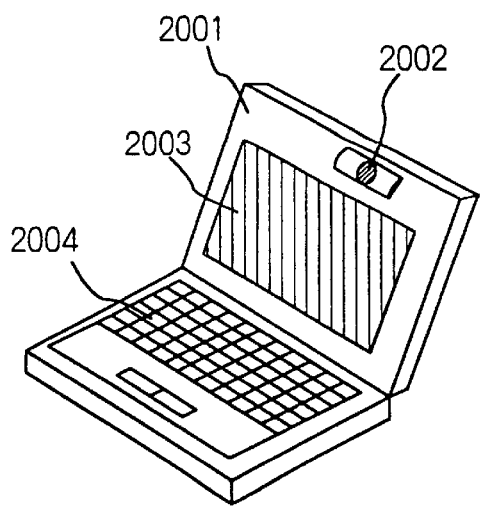
FIGS. 11A through 11F show examples of semiconductor devices (electronic equipments) according to a twelfth embodiment of the invention.

FIG. 11A shows a personal computer which is formed by a main body 2001, an image input portion 2002, a display 2003 and a keyboard 2004. The invention may be applied to the image input portion 2002, display 2003 and other signal control circuits.

Figure 11B:
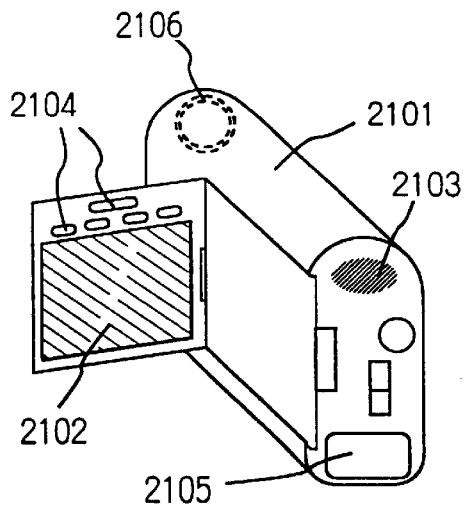

FIG. 11B shows a video camera which is formed by a main body 2101, a display 2102, an audio input portion 2103, operation switches 2104, a battery 2105 and an image receiving portion 2106. The invention may be applied to the display 2102, audio input portion 2103 and other signal control circuits.

Figure 11C:
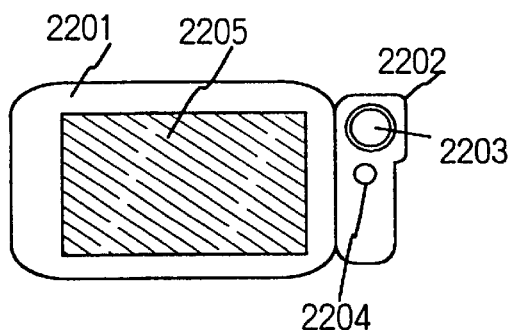

FIG. 11C shows a mobile computer which is formed by a main body 2201, a camera portion 2202, an image receiving portion 2203, operation switches 2204 and a display 2205. The invention may be applied to the display 2205 and other signal control circuits.

Figure 11D:
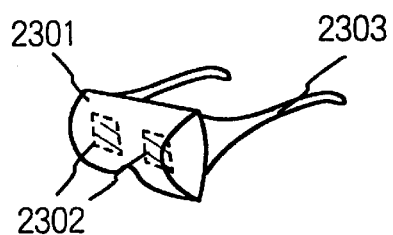

FIG. 11D shows a goggle type display which is formed by a main body 2301, a display 2302 and an arm portion 2303. The invention may be applied to the display 2302 and other signal control circuits.

Figure 11E:
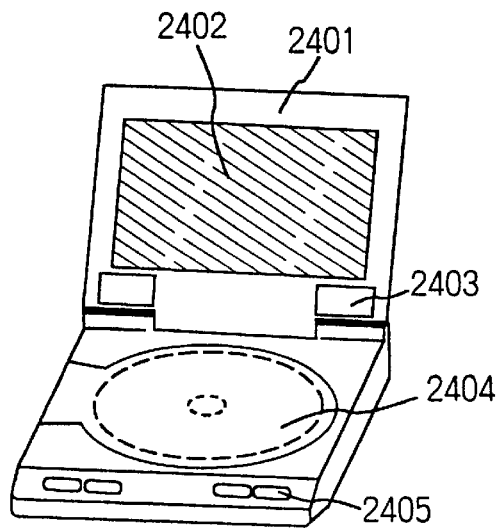

FIG. 11E shows a player utilizing a recording medium on which a program is stored (hereinafter referred to as "recording medium) and which is formed by a main body 2401, a display 2402, a speaker portion 2403, a recording medium 2404 and operation switches 2405. This device utilizes a DVD (digital versatile disc), CD or the like as the recording medium and can be used for enjoying music, movies and internet. The invention may be applied to the display 2402 and other signal control circuits.

Figure 11F:
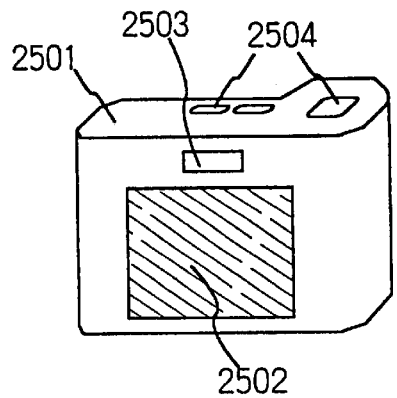

FIG. 11F shows a digital camera which is formed by a main body 2501, a display 2502, an eye-piece 2503, operation switches 2504 and an image receiving portion (not shown). The invention may be applied to the display 2502 and other signal control circuits.

Figure 12A:
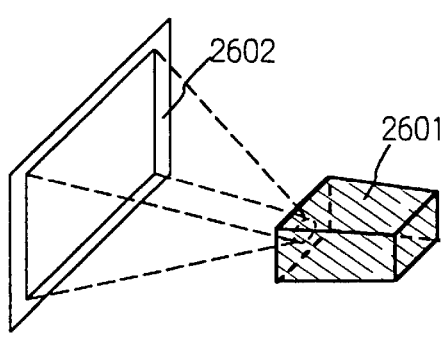
FIGS. 12A through 12D show examples of semiconductor devices (electronic equipments) according to the twelfth embodiment of the invention.

FIG. 12A shows a front type projector which is formed by a display 2601 and a screen 2602. The invention may be applied to the display and other signal control circuits.

Figure 12B:
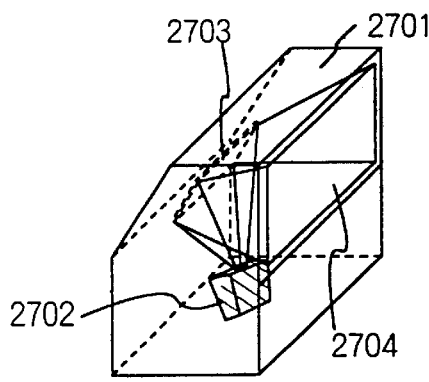

FIG. 12B shows a rear type projector which is formed by a main body 2701, a display 2702, a mirror 2703 and a screen 2704. The invention may be applied to the display and other signal control circuits.

Figure 12C:
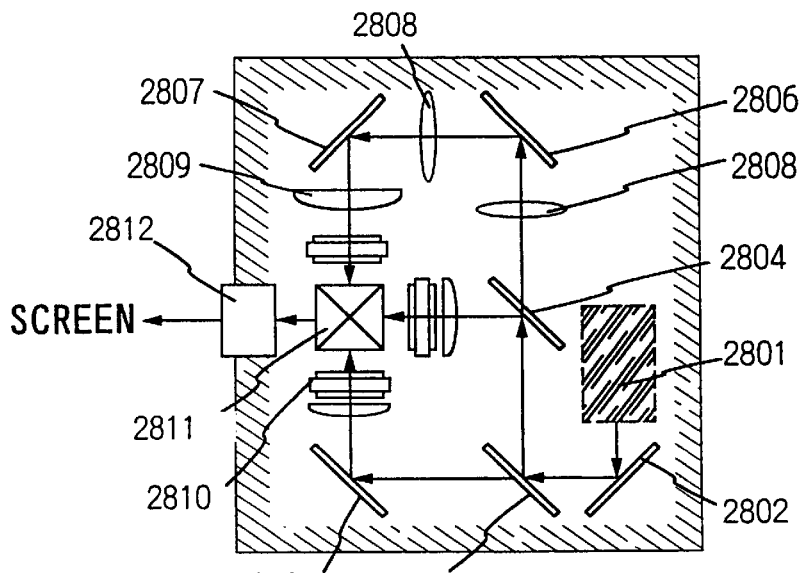

FIG. 12C shows an example of a structure for the displays 2601 and 2702 in FIGS. 12A and 12B, respectively in which displays 2601 and 2702 are formed by a light source optical system 2801, mirrors 2802, 2805, 2806 and 2807, dichroic mirrors 2803 and 2804, optical lenses 2808, 2809 and 2811, liquid crystal displays 2810 and a projection optical system 2812. The projection optical system 2812 is constituted by an optical system including a projection lens. While an example of a three-plate system utilizing three liquid crystal displays 2810 is described in this embodiment, the invention is not limited thereto and, for example, a single-plate system may be used. A person who carries out the invention may provide an appropriate optical system such as an optical lens, a film having a polarizing function, a film for adjusting a phase difference or an IR film in the light path indicated by the arrow in FIG. 12C.

Figure 12D:
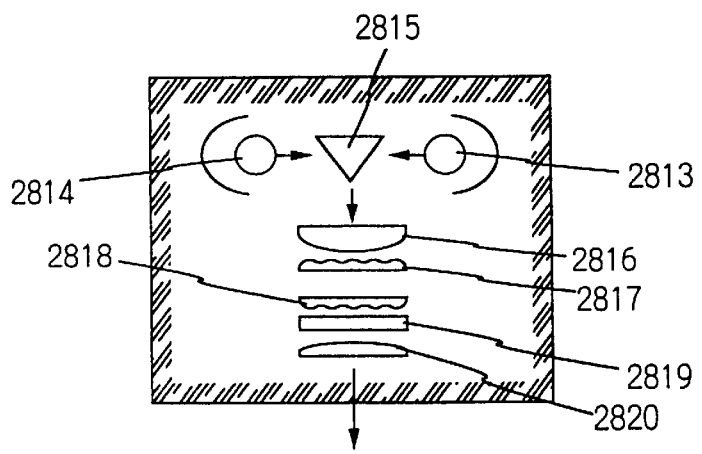

FIG. 12D shows an example of a structure of the light source optical system 2801 in FIG. 12C. In the present embodiment, the light source optical system 2801 is formed by light sources He 2813 and 2814, a composite prism 2815, collimator lenses 2816 and 2820, lens arrays 2817 and 2818 and a polarizing conversion element 2819. While two light sources are used in the light source optical system shown in FIG. 12D, three or four. or even more light sources may be used and, alternatively, only one light source may be used. A person who carries out the invention may provide an appropriate optical system such as an optical lens, a film having a polarizing function, a film for adjusting a phase difference or an IR film in the light source optical system.

As described above, the present invention has a wide range of application and can be used for electronic equipments in any field. The configuration of an electronic equipment according to the present embodiment may be any combination of the first through sixth embodiments, and the embodiments may be used in any combination. Electro-optical devices and semiconductor circuits according to the seventh through eleventh embodiments may also be freely combined.

The present invention makes it possible to provide TFTs having an LDD structure which has high reproducibility, improves the stability of TFTs and provides high productivity.

The use of the invention allows a user to form a desired LDD region on both sides or one side of the channel formation region of a TFT by determining the design for the second mask appropriately in accordance with requirements associated with the circuit configuration. For example, it is possible to form a first n-channel type TFT having a first LDD region with a width in the direction of the channel length in the range from 0.5 to 3 $\mu$m and typically in the range from 1 to 2 $\mu$m and a second n-channel type TFT having a second LDD region with a width in the direction of the channel length in the range from 0.3 to 2 $\mu$m and typically in the range from 0.3 to 0.7 $\mu$m.

The masks used to form an LDD structure can be used as they are as light-blocking films, thereby protecting the active layer especially the channel formation region from deterioration associated with light to improve reliability. TFTs can be manufactured in a short period of time by deleting the mask removing step.

The use of the present invention makes it possible to form an LDD region with a number of masks (seven masks at the minimum) as follows which is less than the number of masks required according to the prior art up to the formation of a source or drain electrode (eight masks at the minimum).

Mask No. 1 for forming gate lines

Mask No. 2 for forming islands

Mask No. 3 for forming a second mask

Mask No. 4 for forming a doping mask to provide p-type conductivity

Mask No. 5 for forming contact holes for source and drain regions

Mask No. 6 for forming a contact hole for a gate line

Mask No. 7 for forming source and drain electrodes

Since the present invention can be carried out using a conventional production line for amorphous silicon TFTs as it is only by introducing several devices, there are industrial advantages.

In addition, since masks serve as insulating films at intersections between gate lines and other lines, a line capacity can be reduced to improve the electrical characteristics of a TFT.

By forming a gate insulating film and a semiconductor film into a multiplicity of layers without exposing them to the atmosphere, a quite clean interface can be provided between them. Especially, since such a configuration makes it possible to keep an interface between an active layer and a gate insulating film which determines the electrical characteristics of TFTs clean, TFTs having less variation and preferable electrical characteristics can be provided.

The threshold voltage which is a typical parameter of a TFT can be in the range from −0.5 to 2 V for an n-channel type TFT and can be in the range from 0.5 to −2 V for a p-channel type TFT. A sub-threshold coefficient (S-value) in the range from 0.1 to 0.3 V/decade can be achieved.

What is claimed is:

1. A semiconductor device comprising:

a gate line formed on an insulating surface;

a gate insulating film in contact with said gate line;

a channel formation region formed over said gate line with said gate insulating film interposed therebetween;

a low density purity region in contact with said channel formation region;

a high density impurity region in contact with said low density impurity region;

a protective film in contact with said channel formation region;

organic resin doped with a trivalent or pentavalent impurity in contact with a part of said protective film; and a layer insulating film formed over the organic resin.

2. A semiconductor device according to claim 1 wherein said gate line has a single-layer or multi-layer structure and is made of one kind of element selected from among tantalum, copper, chromium, aluminum, molybdenum, titanium and silicon or a material primarily constituted by silicon doped with a p-type or n-type impurity.

3. A semiconductor device according to claim 1 wherein said trivalent or pentavalent impurity is phosphorus or boron respectively.

4. A semiconductor device according to claim 1 wherein said organic resin has photosensitivity.

5. A semiconductor device according to claim 1 wherein the density of said trivalent or pentavalent impurity in said organic resin is $1\times10^{19}$ atoms/cm$^3$ or more.

6. A semiconductor device according to claim 1 wherein a catalytic element for promoting the crystallization of silicon is included in said high density impurity region.

7. A semi conductor device according to claim 6 wherein said catalytic element is at least one or a plurality of elements selected from among Ni, Fe, Co, Pt, Cu and Au.

8. A semiconductor device according to claim 6 wherein said catalytic element is Ge or Pb.

9. A semiconductor device according to claim 1 wherein semiconductor device includes a semiconductor circuit comprising a microprocessor, signal processing circuit or high frequency circuit.

10. A semiconductor device according to claim 1 wherein said semiconductor device is an electro-optical device or electronic equipment.

11. A semiconductor device according to claim 10 wherein said electro-optical device is a liquid crystal display, EL display, EC display or image sensor.

12. A semiconductor device according to claim 10 wherein said electronic equipment is a video camera, digital camera, projector, goggle type display, car navigation system, personal computer or personal digital assistant.

13. A semiconductor device comprising:

a gate line formed on an insulating surface;

a gate insulating firm in contact with said gate line;

a channel formation region formed on said gate line with said gate insulating film interposed therebetween;

a low density impurity region formed on one side of said channel formation region;

a drain region constituted by a first high density impurity region in contact with said low density impurity region;

a source region constituted by a second high density impurity region formed on the other side of said channel formation region;

a protective film in contact with said channel formation region;

organic resin doped with a trivalent or pentavalent impurity in contact with a part of said protective film; and a layer insulating film formed over the organic resin.

14. A semiconductor device according to claim 13 wherein said gate line has a single-layer or multi-layer structure and is made of one kind of element selected from among tantalum, copper, chromium, aluminum, molybdenum, titanium and silicon or a material primarily constituted by silicon doped with a p-type or n-type impurity.

15. A semi conductor device according to claim 13 wherein said trivalent or pentavalent impurity is phosphorus or boron respectively.

16. A semiconductor device according to claim 13 wherein said organic resin has photosensitivity.

17. A semiconductor device according to claim 13 wherein the density of said trivalent or pentavalent impurity in said organic resin is $1\times10^{19}$ atoms/cm$^3$ or more.

18. A semiconductor device according to claim 13 wherein a catalytic element for promoting the crystallization of silicon on is included in said high density impurity region.

19. A semiconductor device according to claim 18 wherein said catalytic element is at least one or a plurality of elements selected from among Ni, Fe, Co, Pt, Cu and Au.

20. A semiconductor device according to claim 18 wherein said catalytic element is Ge or Pb.

21. A semiconductor device according to claim 13 wherein semiconductor device includes a semiconductor circuit comprising a microprocessor, signal processing circuit or high frequency circuit.

22. A semiconductor device according to claim 13 wherein said semiconductor device is an electro-optical device or electronic equipment.

23. A semiconductor device according to claim 22 wherein said electro-optical device is a liquid crystal display, EL display, EC display or image sensor.

24. A semiconductor device according to claim 22 wherein said electronic equipment is a video camera, digital camera, projector, goggle type display, car navigation system, personal computer or personal digital assistant.

25. A semiconductor device comprising:
a gate line formed on an insulating surface;
a gate insulating film in contact with said gate line;
a channel formation region formed over said gate line with said gate insulating film interposed therebetween;
a first low density impurity region and a second low density impurity region in contact with said channel formation region;
high density impurity regions in contact with said first low density impurity region and said second low density impurity region;
a protective film in contact with said channel formation region;
organic resin doped with a trivalent or pentavalent impurity in contact with a part of said protective film; and
a layer insulating film formed over the organic resin,
wherein the width of said first low density impurity region in the direction of the channel length is different from the width of said second low density impurity region in the direction of the channel length.

26. A semiconductor device according to claim 25 wherein said gate line has a single-layer or multi-layer structure and is made of one kind of element selected from among tantalum, copper, chromium, aluminum, molybdenum, titanium and silicon or a material primarily constituted by silicon doped with a p-type or n-type impurity.

27. A semiconductor device according to claim 25 wherein said trivalent or pentavalent impurity is phosphorus or boron respectively.

28. A semiconductor device according to claim 25 wherein said organic resin has photosensitivity.

29. A semiconductor device according to claim 25 wherein the density of said trivalent or pentavalent impurity in said organic resin is $1 \times 10^{19}$ atoms/cm$^3$ or more.

30. A semiconductor device according to claim 25 wherein a catalytic element for promoting the crystallization of silicon is included in said high density impurity region.

31. A semiconductor device according to claim 30 wherein said catalytic element is at least one or a plurality of elements selected from among Ni, Fe, Co, Pt, Cu and Au.

32. A semiconductor device according to claim 30 wherein said catalytic element is Ge or Pb.

33. A semiconductor device according to claim 25 wherein semiconductor device includes a semiconductor circuit comprising a microprocessor, signal processing circuit or high frequency circuit.

34. A semiconductor device according to claim 25 wherein said semiconductor device is an electro-optical device or electronic equipment.

35. A semiconductor device according to claim 34 wherein said electro-optical device is a liquid crystal display, EL display, EC display or image sensor.

36. A semiconductor device according to claim 34 wherein said electronic equipment is a video camera, digital camera, projector, goggle type display, car navigation system, personal computer or personal digital assistant.

37. A semiconductor device according to claim 1, wherein said organic resin is a mask for forming said low density impurity region.

38. A semiconductor device according to claim 13, wherein said organic resin is a mask for forming said low density impurity region.

39. A semiconductor device according to claim 25, wherein said organic resin is a mask for forming said first low density impurity region and said second low density impurity region.

40. A semiconductor device according to claim 1, wherein said organic resin is located adjacent to said low density impurity region with a part of said protective film interposed therebetween.

41. A semiconductor device according to claim 13, wherein said organic resin is located adjacent to said low density impurity region with a part of said protective film interposed therebetween.

42. A semiconductor device according to claim 25, wherein said organic resin is located adjacent to said low density impurity region with a part of said protective film interposed therebetween.

* * * * *